(12) United States Patent
Nozawa et al.

(10) Patent No.: US 10,571,797 B2
(45) Date of Patent: Feb. 25, 2020

(54) MASK BLANK, TRANSFER MASK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Hiroaki Shishido, Tokyo (JP); Ryo Ohkubo, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 53 days.

(21) Appl. No.: 15/553,634

(22) PCT Filed: Dec. 24, 2015

(86) PCT No.: PCT/JP2015/085997
§ 371 (c)(1),
(2) Date: Aug. 25, 2017

(87) PCT Pub. No.: WO2016/147518
PCT Pub. Date: Sep. 22, 2016

(65) Prior Publication Data
US 2018/0052387 A1    Feb. 22, 2018

(30) Foreign Application Priority Data

Mar. 19, 2015    (JP) .................................. 2015-055902

(51) Int. Cl.
*G03F 1/32*    (2012.01)
*G03F 1/54*    (2012.01)
(Continued)

(52) U.S. Cl.
CPC .................. *G03F 1/32* (2013.01); *G03F 1/54* (2013.01); *G03F 1/78* (2013.01); *G03F 1/80* (2013.01);
(Continued)

(58) Field of Classification Search
None
See application file for complete search history.

(56) References Cited

U.S. PATENT DOCUMENTS 6,037,083 A * 3/2000 Mitsui ..................... G03F 1/32
430/5
7,622,228 B2 * 11/2009 Okazaki ................... G03F 1/32
430/5
(Continued)

FOREIGN PATENT DOCUMENTS

JP    2003-121988    * 4/2003    ............... G03F 1/08
JP    2003-322947    * 11/2003    ............... G03F 1/08
(Continued)

OTHER PUBLICATIONS

International Search Report for PCT/JP2015/085997 dated Mar. 22, 2016 [PCT/ISA/210].
(Continued)

*Primary Examiner* — Martin J Angebranndt
(74) *Attorney, Agent, or Firm* — Kilpatrick Townsend & Stockton LLP

(57) ABSTRACT

A mask blank is provided, which makes it possible to form a fine transfer pattern in a light-semitransmissive film with high accuracy even if the light-semitransmissive film is made of a material containing silicon and a light shielding film is made of a material containing chromium.
The mask blank 100 has a structure in which the light-semitransmissive film 2, etching mask film 3, and light shielding film 4 are laminated in this order on the transparent substrate 1. It is featured in that the light-semitransmissive film 2 is made of the material containing silicon, the etching mask film 3 is made of the material containing chromium, the light shielding film 4 is made of a material containing chromium and oxygen, and a ratio of the etching rate of the light shielding film 4 to the etching rate of the etching mask
(Continued)

film 3 in the dry etching with an oxygen-containing chlorine-based gas is not less than 3 and not more than 12.

36 Claims, 4 Drawing Sheets

(51) Int. Cl.
    *G03F 1/78*     (2012.01)
    *G03F 1/80*     (2012.01)
    *H01L 21/308*     (2006.01)
    *G03F 7/20*     (2006.01)

(52) U.S. Cl.
    CPC ........ *G03F 7/2002* (2013.01); *H01L 21/3081* (2013.01); *H01L 21/3086* (2013.01)

(56) References Cited

U.S. PATENT DOCUMENTS

| | | | |
|---|---|---|---|
| 7,709,161 B2* | 5/2010 | Okubo | G03F 1/80 430/5 |
| 7,767,366 B2* | 8/2010 | Yoshikawa | G03F 1/32 430/311 |
| 9,268,212 B2* | 2/2016 | Fukaya | G03F 1/32 |
| 2006/0223224 A1* | 10/2006 | Akagawa | G03F 1/60 438/106 |
| 2007/0020534 A1 | 1/2007 | Yoshikawa et al. | |
| 2007/0212618 A1 | 9/2007 | Yoshikawa et al. | |
| 2009/0253054 A1* | 10/2009 | Kominato | G03F 1/32 430/5 |
| 2009/0325084 A1* | 12/2009 | Hashimoto | G03F 1/32 430/5 |
| 2010/0075236 A1* | 3/2010 | Hashimoto | G03F 1/32 430/5 |
| 2011/0104592 A1 | 5/2011 | Iwashita et al. | |
| 2011/0177436 A1 | 7/2011 | Hashimoto et al. | |
| 2011/0189595 A1* | 8/2011 | Tanabe | C03C 19/00 430/5 |
| 2012/0009791 A1* | 1/2012 | Zhang | B82Y 10/00 438/694 |
| 2015/0160549 A1* | 6/2015 | Sasamoto | G03F 1/26 430/5 |
| 2016/0187769 A1 | 6/2016 | Nozawa et al. | |
| 2016/0202602 A1 | 7/2016 | Shishido et al. | |

FOREIGN PATENT DOCUMENTS

| | | |
|---|---|---|
| JP | 2007-033469 A | 2/2007 |
| JP | 2007-241065 A | 9/2007 |
| JP | 2007-241136 A | 9/2007 |
| JP | 2011-164598 A | 8/2011 |
| JP | 2015-111212 A | 6/2015 |
| JP | 2016-004223 A | 1/2016 |
| WO | 2007/074806 A1 | 7/2007 |
| WO | 2009/123170 A1 | 10/2009 |
| WO | 2014/189004 A1 | 11/2014 |
| WO | 2015/045801 A1 | 4/2015 |

OTHER PUBLICATIONS

Written Opinion for PCT/JP2015/085997 dated Mar. 22, 2016 [PCT/ISA/237].

* cited by examiner

MASK BLANK, TRANSFER MASK, METHOD FOR MANUFACTURING TRANSFER MASK, AND METHOD FOR MANUFACTURING SEMICONDUCTOR DEVICE

CROSS REFERENCE TO RELATED APPLICATIONS

This application is a National Stage of International Application No. PCT/JP2015/085997 filed Dec. 24, 2015, claiming priority based on Japanese Patent Application No. 2015-055902 filed Mar. 19, 2015, the contents of all of which are incorporated by reference herein in their entirety.

TECHNICAL FIELD

The present disclosure relates to a mask blank, a transfer mask, a method for manufacturing a transfer mask, and a method for manufacturing a semiconductor device.

BACKGROUND ART

In a manufacturing process of a semiconductor device, a fine pattern is generally formed using a photolithographic method. In the formation of the fine pattern, multiple substrates, which are referred to as transfer masks, are usually used. The transfer mask is formed by providing the fine pattern comprised of a metal thin film, etc. on a generally transparent glass substrate. The photolithographic method is also used in the manufacture of the transfer mask.

Refinement of a pattern for the semiconductor device requires shortening of a wavelength of an exposure light source used in photolithography, in addition to the refinement of a mask pattern formed in the transfer mask. Nowadays, the exposure light sources used in the manufacture of semiconductor devices are shifting from KrF excimer lasers (wavelength: 248 nm) to ArF excimer lasers (wavelength: 193 nm), that is, shorter wavelength light sources are increasingly used.

The known types of transfer masks include a half tone phase shift mask, in addition to a conventional binary mask including a light shielding film pattern made of a chromium-based material on a transparent substrate. The half tone phase shift mask includes a light-semitransmissive film pattern on the transparent substrate. The light-semitransmissive film (half tone phase shift film) has functions to transmit light at an intensity not substantially contributing to the light exposure and to generate a predetermined phase difference between the light transmitted through the light-semitransmissive film and the light transmitted through the air for the same distance, thereby generating a so-called phase shift effect.

Generally, an outer peripheral region of the transfer mask outside the region where a transfer pattern is formed is required to ensure optical density (OD) of not less than a predetermined value such that, upon the exposure transfer to a resist film on a semiconductor wafer using an exposure apparatus, the resist film will not be affected by the exposure light transmitted through the outer peripheral region. Usually, the outer peripheral region of the transfer mask desirably has OD of 3 or more, and at least about 2.8 of OD is necessary. However, the light-semitransmissive film of the half tone phase shift mask has a function to transmit the exposure light at a predetermined transmittance, and it is difficult to ensure the optical density required in the outer peripheral region of the transfer mask with the light-semitransmissive film alone. Therefore, as with a phase shift mask blank disclosed in Patent Document 1, a light shielding film (light blocking film) is laminated onto a semitransparent film having predetermined phase shift amount and transmittance with respect to the exposure light to ensure the predetermined optical density in a laminated structure of the semitransparent film and the light shielding film.

There is also a phase shift mask blank as disclosed in Patent Document 2, in which a light shielding film provided on a phase shift film is made of a material containing a transition metal and silicon. In this phase shift mask blank, the material containing a transition metal and silicon is also used as a material for forming the phase shift film, as is conventionally done. Therefore, it is difficult to ensure etching selectivity between the phase shift film and the light shielding film in the dry etching. The phase shift mask blank of Patent Document 2 includes, between the phase shift film and the light shielding film, an etching stopper film made of a material containing chromium. It further includes, on the light shielding film, an etching mask film made of the material containing chromium.

PRIOR ART DOCUMENTS

Patent Documents

Patent Document 1: Japanese Patent Application Publication 2007-033469
Patent Document 2: Japanese Patent Application Publication 2007-241065
Patent Document 3: Japanese Patent Application Publication 2007-241136

SUMMARY

Problems to be Solved

A transfer mask which includes a transfer pattern formed in a light-semitransmissive film (phase shift film) having a property of transmitting the exposure light at a predetermined transmittance, such as the half tone phase shift mask, needs to have a light shielding band formed in an outer peripheral region (blind area) outside a region where the transfer pattern is formed. Thus, a mask blank for manufacturing the half tone phase shift mask (hereinafter simply referred to as a phase shift mask) is generally configured such that the light-semitransmissive film and the light shielding film are laminated on a transparent substrate, as disclosed in Patent Document 1. However, when manufacturing a transfer mask from such a mask blank, the dry etching using as a mask a resist pattern having a transfer pattern to be formed in the phase shift film cannot be performed directly on the light-semitransmissive film.

In the general phase shift mask, the phase shift film is provided with a fine pattern, and the light shielding film is provided with a light shielding pattern for forming the light shielding band, etc. to satisfy the predetermined optical density in the laminated structure of the light shielding film and the light-semitransmissive film. That is, in the phase shift mask, the phase shift film and the light shielding film have respective different patterns formed therein. Thus, for the mask blank of a laminated structure which includes the light shielding film provided on and in direct contact with the phase shift film, materials with different etching properties are used for the phase shift film and the light shielding film, respectively. The phase shift film often needs to have not only a function to transmit the light at the predetermined transmittance but also a function to control the phase of the light transmitted through the phase shift film. A material containing silicon is often used as a material for the phase shift film since it easily provides the optical properties required for such a phase shift film.

A thin film made of the material containing silicon is generally patterned by the dry etching using a fluorine-based gas. The material having etching durability in the dry etching using the fluorine-based gas includes the material containing chromium. A thin film made of the material containing chromium can be patterned by the dry etching using a mixed gas of a chlorine-based gas and an oxygen gas (hereinafter referred to as an oxygen-containing chlorine-based gas). The thin film made of the material containing silicon has etching durability in the dry etching using the oxygen-containing chlorine-based gas. The thin film made of the material containing chromium and the thin film made of the material containing silicon are a combination by which both thin films can obtain sufficient etching selectivity.

When a phase shift mask is manufactured from this mask blank, the dry etching is performed on the light shielding film using as a mask a resist pattern having a transfer pattern to be formed in the phase shift film, so that the transfer pattern to be formed in the phase shift film is formed earlier in the light shielding film. Then, the dry etching is performed on the light-semitransmissive film using as a mask the light shielding film having this transfer pattern formed therein, so that the transfer pattern is formed in the phase shift film. However, the dry etching using the oxygen-containing chlorine-based gas which is performed on the light shielding film made of the material containing chromium has a tendency toward isotropic etching because, for example, the etching gas contains the oxygen gas plasma mainly composed of radicals, and thus, it is difficult to enhance etching anisotropy.

The generally used resist film made of an organic material has resistance to the oxygen gas plasma which is significantly lower than the resistance to other gas plasma. Thus, if the light shielding film made of a chromium-based material is dry-etched with the oxygen-containing chlorine-based gas, an amount of consumption of the resist film (a reduction amount of thickness of the resist film during the etching) becomes large. In order to form the fine pattern in the light shielding film with great accuracy by the dry etching, the resist film having a predetermined thickness or more should remain upon completion of the patterning of the light shielding film. However, if the thickness of the resist film in which the pattern is formed first is increased, a cross-sectional aspect ratio of the resist pattern (a ratio of film thickness to pattern line width) becomes too large, and thus, a phenomenon of resist pattern collapse tends to take place. It is possible to solve these problems by significantly reducing the thickness of the light shielding film. However, since the light shielding film needs to have predetermined optical density in relation to the exposure light, it is difficult to configure the light shielding film to have a thickness with which the problems relating to the etching can be solved.

As described above, when a fine transfer pattern to be formed in the light-semitransmissive film is formed in the light shielding film by the dry etching using the oxygen-containing chlorine-based gas, it is difficult to enhance the accuracy of pattern shape and the in-plane CD uniformity. In forming the transfer pattern in the light-semitransmissive film, the dry etching using the fluorine-based gas which has a high tendency toward anisotropic etching is applied. However, the light shielding film in which the highly accurate formation of the fine transfer pattern is difficult should be used as an etching mask in the dry etching, and thus, it is difficult to form the fine transfer pattern in the light-semitransmissive film. Therefore, as for the mask blank including the light shielding film between the light-semitransmissive film and the resist film made of the organic material, what has been sought is that the transfer pattern is finally formed in the light-semitransmissive film with high accuracy, beginning with the resist film having the fine transfer pattern to be formed in the light-semitransmissive film.

The mask blank disclosed in Patent Document 2 has been devised as a means for solving the problem of the above described mask blank. In this mask blank, a transition metal silicide-based material that can be dry-etched with the fluorine-based gas is used for the light shielding film which should have a predetermined thickness or more, so that the fine pattern can be formed in the light shielding film with high accuracy. Further, since the light shielding film does not have etching selectivity in relation to the phase shift film, an etching stopper film made of the chromium-based material is provided between the phase shift film and the light shielding film. Basically, there is no limitation on the optical density of the etching stopper film. The etching stopper film only has to have a thickness such that it can function as an etching mask in the dry etching with the fluorine-based gas for forming the fine transfer pattern in the phase shift film, so that it can be significantly thinned compared to the conventional light shielding film made of the chromium-based material. Therefore, while the etching stopper film is made of the chromium-based material that is hard to be etched in a highly anisotropic manner, the fine pattern can be formed therein with high accuracy.

Furthermore, the mask blank of Patent Document 2 includes an etching mask film made of the chromium-based material on the light shielding film. While the light shielding film can be dry-etched with the fluorine-based gas, it includes some thickness. Thus, the side walls of the resist film made of the organic material significantly decline during the etching of the light shielding film. If the etching mask film made of the chromium-based material which has high etching durability in the dry etching with the fluorine-based gas is used as an etching mask, the decline of patterned sidewalls of the etching mask film can be reduced, so that the fine pattern can be formed in the light shielding film with higher accuracy.

However, the mask blank of Patent Document 2 has a complex structure in which the phase shift film made of the transition metal silicide-based material, the etching stopper film made of the chromium-based material, the light shielding film made of the transition metal silicide-based material, and the etching mask film made of the chromium-based material are laminated on the transparent substrate. The manufacture of a phase shift mask using the mask blank of Patent Document 2 has the problem that the manufacturing process is complex because the mask blank has the complex structure comprised of alternately laminated films with different etching properties. Even only the process until the formation of the transfer pattern in the phase shift film has to include the steps of patterning an etching mask film by the dry etching using as a mask a resist film having a transfer pattern to be formed in a phase shift film; patterning a light shielding film by the dry etching using as a mask the etching mask film having the transfer pattern; patterning an etching stopper film by the dry etching using as a mask the light shielding film having the transfer pattern; and patterning the phase shift film by the dry etching using as a mask the etching stopper film having the transfer pattern.

The mask blank disclosed in Patent Document 3 is for the manufacture of a chromeless phase shift mask (chromeless phase lithography (CPL) mask). This mask blank also has a complex structure in which an etching stopper film made of a chromium-based material, a light shielding film made of a transition metal silicide-based material, and an etching mask film made of a chromium-based material are laminated on a transparent substrate. Therefore, the manufacture of the chromeless phase shift mask using this mask blank has the problem with the complex manufacturing process.

The present disclosure was made to solve the above existing problems. It is an aspect of the present disclosure to provide a mask blank which includes a light shielding film made of a material containing chromium on a light-semitransmissive film made of a material containing silicon, wherein a fine pattern can be formed in the light-semitransmissive film with high accuracy. It is another aspect of the present disclosure to provide a mask blank which includes a light shielding film made of a material containing chromium on a transparent substrate, wherein a fine etching pattern can be formed in the transparent substrate with high accuracy. Further, it is still another aspect of the present disclosure to provide transfer masks manufactured using the above-described mask blanks, and methods for manufacturing the transfer masks. Additionally, it is yet another aspect of the present disclosure to provide methods for manufacturing semiconductor devices using these transfer masks.

EMBODIMENTS

The inventors achieved the present disclosure as a result of the diligent study for solving the above problems. That is, in order to solve the above problems, the present disclosure includes the following configurations.

(Configuration 1)

A mask blank having a structure in which a light-semitransmissive film, an etching mask film, and a light shielding film are laminated in this order on a transparent substrate, wherein the light-semitransmissive film is made of a material containing silicon, wherein the etching mask film is made of a material containing chromium, wherein the light shielding film is made of a material containing chromium and oxygen, and wherein a ratio of the etching rate of the light shielding film to the etching rate of the etching mask film in the dry etching using an oxygen-containing chlorine-based gas is not less than 3 and not more than 12.

(Configuration 2)

The mask blank according to Configuration 1, wherein the etching mask film is made of a material which contains chromium and further contains at least one or more elements selected from carbon and silicon.

(Configuration 3)

The mask blank according to Configuration 1 or 2, wherein the total content of oxygen and nitrogen in the etching mask film is 5 atom % or less.

(Configuration 4)

The mask blank according to any one of Configurations 1 to 3, wherein the oxygen content in the light shielding film is 10 atom % or more.

(Configuration 5)

The mask blank according to any one of Configurations 1 to 4, wherein the light shielding film is made of a material which does not substantially contain silicon.

(Configuration 6)

The mask blank according to any one of Configurations 1 to 5, wherein the light-semitransmissive film is made of a material containing silicon and nitrogen.

(Configuration 7)

A mask blank having a structure in which an etching mask film and a light shielding film are laminated in this order on a transparent substrate, wherein the etching mask film is made of a material containing chromium, wherein the light shielding film is made of a material containing chromium and oxygen, and wherein a ratio of the etching rate of the light shielding film to the etching rate of the etching mask film in the dry etching using an oxygen-containing chlorine-based gas is not less than 3 and not more than 12.

(Configuration 8)

The mask blank according to Configuration 7, wherein the etching mask film is made of a material which contains chromium and further contains at least one or more elements selected from carbon and silicon.

(Configuration 9)

The mask blank according to Configuration 7 or 8, wherein the total content of oxygen and nitrogen in the etching mask film is 5 atom % or less.

(Configuration 10)

The mask blank according to any one of Configurations 7 to 9, wherein the oxygen content in the light shielding film is 10 atom % or more.

(Configuration 11)

The mask blank according to any one of Configurations 7 to 10, wherein the light shielding film is made of a material which does not substantially contain silicon.

(Configuration 12)

A transfer mask, wherein a first pattern including a transfer pattern is formed in the light-semitransmissive film of the mask blank according to any one of Configurations 1 to 6, and a second pattern including a light shielding band pattern is formed in the etching mask film and the light shielding film.

(Configuration 13)

A transfer mask, wherein a third pattern including a transfer pattern comprised of an etching pattern is formed in the transparent substrate of the mask blank according to any one of Configurations 7 to 11, and a fourth pattern including a light shielding band pattern is formed in the etching mask film and the light shielding film.

(Configuration 14)

A method for manufacturing a transfer mask using the mask blank according to any one of Configurations 1 to 6, wherein the transfer mask has a first pattern including a transfer pattern in the light-semitransmissive film, and has a second pattern including a light shielding band pattern in the etching mask film and the light shielding film, and wherein the method includes:

forming the second pattern in the light shielding film by dry etching with an oxygen-containing chlorine-based gas using a first resist film having the second pattern formed on the light shielding film as a mask;

forming the first pattern in the etching mask film by dry etching with the oxygen-containing chlorine-based gas using a second resist film having the first pattern formed on the etching mask film and the light shielding film as a mask;

forming the first pattern in the light-semitransmissive film by dry etching with a fluorine-based gas using the etching mask film having the first pattern as a mask; and forming the second pattern in the etching mask film by dry etching with the oxygen-containing chlorine-based gas using a third resist film having the second pattern formed on the light shielding film as a mask.

(Configuration 15)

A method for manufacturing a transfer mask using the mask blank according to any one of Configurations 7 to 11, wherein the transfer mask has a third pattern including a transfer pattern comprised of an etching pattern in the transparent substrate, and has a fourth pattern including a light shielding band pattern in the etching mask film and the light shielding film; and wherein the method includes:

forming the fourth pattern in the light shielding film by dry etching with an oxygen-containing chlorine-based gas using a fourth resist film having the fourth pattern formed on the light shielding film as a mask;

forming the third pattern in the etching mask film by dry etching with the oxygen-containing chlorine-based gas using as a fifth resist film having the third pattern formed on the etching mask film and the light shielding film a mask;

etching into a surface of the transparent substrate to form the third pattern by dry etching with a fluorine-based gas using the etching mask film having the third pattern as a mask; and forming the fourth pattern in the etching mask film by dry etching with the oxygen-containing chlorine-based gas using a sixth resist film having the fourth pattern formed on the light shielding film as a mask.

(Configuration 16)

A method for manufacturing a semiconductor device, including the exposure step in which the transfer mask according to Configuration 12 or 13 is used to transfer a transfer pattern of the transfer mask onto a semiconductor substrate by a lithographic method.

(Configuration 17)

A method for manufacturing a semiconductor device, including the exposure step in which the transfer mask manufactured by the method for manufacturing a transfer mask according to Configuration 14 or 15 is used to transfer a transfer pattern of the transfer mask onto a semiconductor substrate by a lithographic method.

Effect of the Disclosure

According to the present disclosure, in a mask blank having a structure in which a light-semitransmissive film, an etching mask film, and a light shielding film are laminated in this order on a transparent substrate, even if the light-semitransmissive film is made of a material containing silicon and the light shielding film is made of a material containing chromium, a fine transfer pattern can be formed in the light-semitransmissive film with high accuracy. Also, the mask blank of the present disclosure can be used to manufacture a transfer mask having a pattern formed in the light-semitransmissive film with high accuracy. Further, this transfer mask can be used to manufacture a semiconductor device having a fine pattern with high accuracy.

According to the present disclosure, in a mask blank having a structure in which an etching mask film and a light shielding film are laminated in this order on a transparent substrate, even if the light shielding film is made of a material containing chromium, a fine etching pattern can be formed in the transparent substrate with high accuracy. Also, the mask blank of the present disclosure can be used to manufacture a transfer mask having the etching pattern formed in the transparent substrate with high accuracy. Further, this transfer mask can be used to manufacture a semiconductor device having a fine pattern with high accuracy.

DESCRIPTION OF EMBODIMENTS

Figure 1:
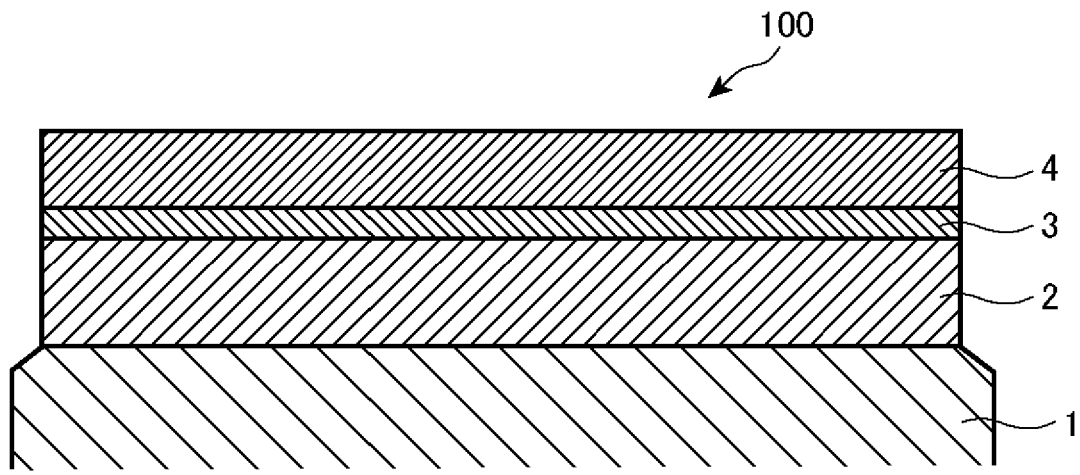
FIG. 1 is a cross-sectional view showing a structure of a mask blank according to Embodiment 1 of the present disclosure.
Figure 2:
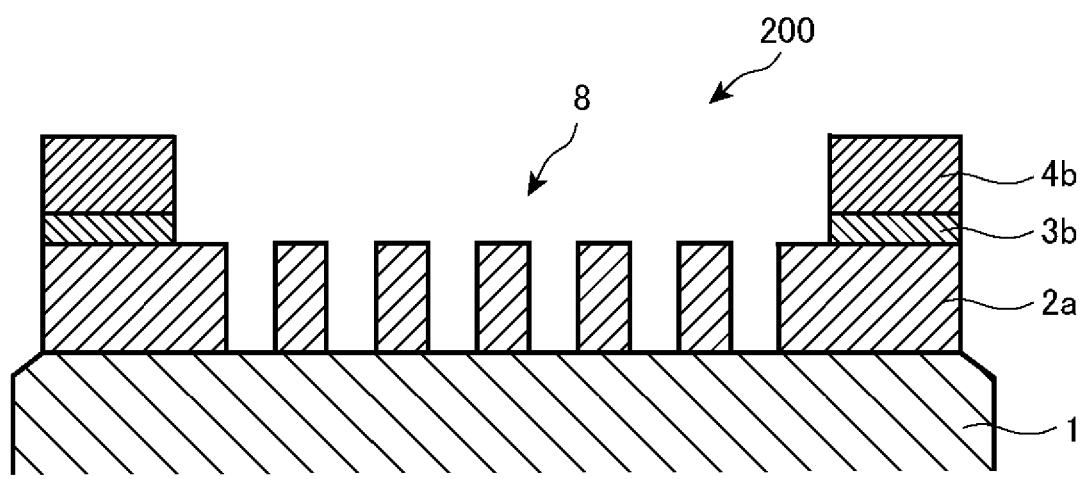
FIG. 2 is a cross-sectional view showing a structure of a transfer mask according to Embodiment 1 of the present disclosure.

Embodiment 1 of the present disclosure is described in detail below. FIG. 1 is a cross-sectional view showing a structure of a mask blank according to Embodiment 1 of the present disclosure. The mask blank 100 of the present disclosure shown in FIG. 1 has a structure in which a light-semitransmissive film 2, an etching mask film 3, and a light shielding film 4 are laminated in this order on a transparent substrate 1. FIG. 2 is a cross-sectional view showing a structure of a transfer mask (phase shift mask) according to Embodiment 1 of the present disclosure. The transfer mask 200 of the present disclosure shown in FIG. 2 has a structure in which a light-semitransmissive film (light-semitransmissive pattern) 2a with a first pattern including a transfer pattern 8 formed therein, an etching mask film (etching mask pattern) 3b with a second pattern including a light shielding band pattern formed therein, and a light shielding film (light shielding pattern) 4b with the second pattern formed therein are laminated in this order. The transfer mask 200 is comprised of the transparent substrate 1, and a laminated structure of the light-semitransmissive pattern 2a, the etching mask pattern 3b, and the light shielding pattern 4b.

In the mask blank according to Embodiment 1 of the present disclosure, the light-semitransmissive film 2 is made of a material containing silicon, the etching mask film 3 is made of a material containing chromium, and the light shielding film 4 is made of a material containing chromium and oxygen. In particular, it is featured in that a ratio of the etching rate of the light shielding film to the etching rate of the etching mask film in the dry etching using the oxygen-containing chlorine-based gas is not less than 3 and not more than 12.

The light-semitransmissive film 2 made of the material containing silicon needs to be patterned by the dry etching with a fluorine-based gas. There are limited materials which provide sufficient etching selectivity in relation to the material containing silicon in the dry etching with the fluorine-based gas, and the material containing chromium is superior in this regard. Conventionally, the material containing chromium has been used for the etching mask film 3, and the transition metal silicide-based material has been used for the light shielding film 4. However, this structure has the above described problems.

Thus, the inventors made a diligent study on a structure which makes it possible to form the fine transfer pattern in the light-semitransmissive film 2 with high accuracy even if the material containing chromium is used for both the etching mask film 3 and the light shielding film 4. If the light shielding film 4 is made of the material containing chromium, it is difficult to reduce its thickness to a predetermined thickness or less due to a restriction of optical density. In view of this, the inventors reached the conclusion that the process of manufacturing a transfer mask from a mask blank should not include the dry etching on the light shielding film 4 with the oxygen-containing chlorine-based gas using as a mask a resist film having a pattern (first pattern) including a transfer pattern to be formed in the light-semitransmissive film 2. Further, they conceived that the forming, in the light shielding film 4, a pattern (second pattern) including a light shielding band pattern that is to be included in the light shielding film 4 upon the completion of the transfer mask is performed earlier in the process of manufacturing a transfer mask from a mask blank. By doing so, a surface of the etching mask film 3 is exposed in a transfer pattern forming region, so that the etching mask film 3 can be subjected directly to the dry etching with the oxygen-containing chlorine-based gas using as a mask the resist film having the pattern (first pattern) including the transfer pattern to be formed in the light-semitransmissive film 2.

On the one hand, it was found that in the dry etching with the oxygen-containing chlorine-based gas for forming the second pattern in the light shielding film 4, the etch selectivity between the light shielding film 4 and the etching mask film 3 may be lower than the etch selectivity between the conventional light shielding film made of the transition metal silicide-based material and the conventional etching mask film made of the chromium-based material (etch selectivity such that the reduction amount of thickness of the etching mask film due to the patterning of the light shielding film by the dry etching is 1 nm or less). It was also found that if the etching mask film 3 with the thickness of 2 nm or more remains at the completion of the dry etching for forming the second pattern in the light shielding film 4, the first pattern can be formed in the etching mask film 3 with accuracy by the dry etching with the oxygen-containing chlorine-based gas using as a mask the resist film having the first pattern.

On the other hand, it was found that if the reduction amount of thickness of the etching mask film due to the dry etching for forming the second pattern in the light shielding film 4 is too large (5 nm or more), it becomes difficult to form the first pattern in the etching mask film 3 with accuracy. It appears that the etching mask film only has to be formed to have the thickness in view of the above reduction amount during the manufacture of the mask blank. However, when forming the pattern in the thin film by the dry etching, regions in the thin film where the surfaces are exposed without the masking by the resist film, etc. are not entirely removed at a time. Due to differences in conditions such as a difference in density of the pattern or etching gas distribution, the difference of the in-plane etching rate is inevitably caused. It is difficult to avoid a time difference between the region where the etching first reaches the lower end of the thin film and the region where the etching last reaches the lower end of the thin film, and the time difference tends to become large if the regions to be removed by the etching are large.

In the region where the etching first reaches the lower end of the light shielding film 4, the surface of the etching mask film 3 is continuously exposed to the etching gas until the etching reaches the lower end of the light shielding film 4 throughout all the regions to be removed. In the region where the etching last reaches the lower end of the light shielding film 4, the surface of the etching mask film 3 is hardly exposed to the etching gas. There is a constant correlation between the duration of exposure of the etching mask film 3 to the etching gas and the reduction amount of thickness of the etching mask film 3. That is, if the reduction amount of thickness of the etching mask film 3 due to the dry etching for forming the second pattern in the light shielding film 4 is 5 nm, the difference in film thickness distribution in a plane of the etching mask film 3 is estimated to be 5 nm, if simply calculated. When the difference in film thickness distribution in the etching mask film 3 is large during the dry etching for forming in the etching mask film 3 the pattern (first pattern) including the transfer pattern to be formed in the light-semitransmissive film 2, the accuracy of the first pattern formed in the etching mask film 3 is significantly deteriorated.

In view of the above technical problems, the inventors concluded that the ratio of the etching rate of the light shielding film 4 to the etching rate of the etching mask film 3 in the dry etching with the oxygen-containing chlorine-based gas should be such that the reduction amount of thickness of the etching mask film 3 due to the dry etching for forming the second pattern in the light shielding film 4 is less than 5 nm. In particular, the ratio of the etching rate RA of the light shielding film 4 to the etching rate RE of the etching mask film 3 in the dry etching with the oxygen-containing chlorine-based gas (hereinafter referred to as RA/RE ratio) should be 3 or more. The RA/RE ratio is preferably 3.2 or more, and more preferably 3.5 or more.

As described below, the chromium-based material containing silicon causes the etching rate in the dry etching with the oxygen-containing chlorine-based gas to be reduced in a significant extent. When the etching rate in the dry etching of the etching mask film 3 with the oxygen-containing chlorine-based gas is reduced, the reduction amount of thickness of the etching mask film 3 due to the dry etching for forming the second pattern in the light shielding film 4 is decreased. However, the dry etching with the oxygen-containing chlorine-based gas using as a mask the resist film having the pattern (first pattern) including the transfer pattern to be formed in the light-semitransmissive film 2 should form the pattern in the etching mask film 3 with high accuracy. As the etching rate in the dry etching of the etching mask film 3 with the oxygen-containing chlorine-based gas becomes slow, the resist film having the first pattern needs to be thickened. If the thickness of the resist film having the first pattern becomes 100 nm or more, the technical significance of provision of the etching mask film 3 is diminished (the resist film with the thickness of 20 nm or more should remain after the completion of the patterning of the etching mask film 3).

In view of the above, the inventors concluded that the RA/RE ratio should be such that even if the thickness of the resist film used in the dry etching for forming the first pattern in the etching mask film 3 is less than 100 nm, the first pattern can be formed in the etching mask film 3 with high accuracy. In particular, the RA/RE ratio should be 12 or less. The RA/RE ratio is preferably 10 or less, and more preferably 8 or less.

If the etching rate in the dry etching of the light shielding film 4 with the oxygen-containing chlorine-based gas is slow, it is difficult to achieve the above RA/RE ratio range. Thus, the light shielding film 4 should be made of a material containing at least chromium and oxygen. The oxygen content in the light shielding film 4 is preferably 10 atom % or more, more preferably 15 atom % or more, and further preferably 20 atom % or more, in order to enhance the RA/RE ratio.

The material containing chromium and oxygen tends to lower the optical density per unit film thickness in relation to the exposure light as the oxygen content increases. Since the light shielding film 4 should ensure the predetermined optical density, it is necessary to thicken the light shielding film 4 as the oxygen content in the light shielding film 4 increases. When the light shielding film 4 is thickened, the resist film having the second pattern, which is used in the dry etching for forming the second pattern in the light shielding film 4, should also be thickened. In view of these points, the oxygen content in the light shielding film 4 is preferably 40 atom % or less, more preferably 35 atom % or less, and further preferably 30 atom % or less.

As described below, the chromium-based material containing silicon causes the etching rate in the dry etching with the oxygen-containing chlorine-based gas to be significantly reduced. Thus, it is desirable that the material for forming the light shielding film 4 does not substantially contain silicon. The phrase "not substantially contain silicon" here means that the silicon content in the light shielding film 4 is less than 1 atom %. The silicon content in the light shielding film 4 is more preferably not more than the detection lower limit. In the light shielding film 4, the maximum peak of Si2p narrow spectrum obtained by X-ray photoelectron spectroscopy analysis is further preferably not more than the detection lower limit.

The light shielding film 4 may contain elements (such as hydrogen, boron, indium, and tin) other than the above as long as the etching rate in the dry etching with the oxygen-containing chlorine-based gas does not significantly change. Further, the light shielding film 4 may contain a noble gas element such as helium, neon, argon, krypton, and xenon. The light shielding film 4 may contain carbon if its oxygen content is 10 atom % or more. This is because the reduction in etching rate of the light shielding film 4 due to the inclusion of carbon is less remarkable than the reduction due to silicon. The preferable material for the light shielding film 4 includes, for example, CrON, CrOC, and CrOCN.

When the light shielding film 4 is thickened, the resist film having the second pattern (light shielding pattern), which is used in the dry etching for forming the second pattern in the light shielding film 4, should also be thickened. Thus, the thickness of the light shielding film 4 is preferably 70 nm or less, more preferably 60 nm or less, and further preferably 50 nm or less. Also, the predetermined optical density is required for the light shielding film 4. If the thinning of the light shielding film 4 is attempted, the content of oxygen or nitrogen which triggers the reduction in optical density of the material should be decreased. When the content of oxygen or nitrogen in the light shielding film 4 is decreased, the etching rate in the dry etching of the light shielding film 4 with the oxygen-containing chlorine-based gas is also decreased. Thus, the thickness of the light shielding film 4 is preferably 20 nm or more, more preferably 25 nm or more, and further preferably 30 nm or more.

On the other hand, even if the etching mask film 3 is made of Cr metal alone without containing oxygen or nitrogen which is an element triggering the increase of the etching rate in the dry etching with the oxygen-containing chlorine-based gas, it is difficult to achieve the RA/RE ratio of 3 or more. The chromium-based material containing silicon can cause the etching rate in the dry etching with the oxygen-containing chlorine-based gas to be significantly reduced. The chromium-based material containing carbon can also cause the etching rate in the dry etching with the oxygen-containing chlorine-based gas to be reduced, though not to the extent of reduction due to the silicon inclusion. From these matters, the etching mask film 3 is preferably made of a material which contains chromium and further contains at least one or more elements selected from carbon and silicon.

As mentioned above, the etching rate in the dry etching with the oxygen-containing chlorine-based gas is significantly reduced due to the inclusion of silicon in the etching mask film 3. Further, as the etching rate in the dry etching of the etching mask film with the oxygen-containing chlorine-based gas becomes slow, the resist film having the first pattern (light-semitransmissive pattern) should be thickened. In view of this, the silicon content in the etching mask film 3 should be at least 10 atom % or less, preferably 8 atom % or less, and more preferably 6 atom % or less. In order to ensure the RA/RE ratio of 3 or more, it may be desired for the etching mask film 3 to have the silicon content of 1 atom % or more. In the etching mask film 3, the Si2p narrow spectrum obtained by X-ray photoelectron spectroscopy analysis preferably has the maximum peak at a binding energy of not less than 98 eV and not more than 101 eV.

The chromium-based material containing carbon causes the etching rate in the dry etching with the oxygen-containing chlorine-based gas to be reduced, though not to the extent of reduction due to the silicon inclusion. The carbon content in the etching mask film 3 should be at least 10 atom % or less, preferably 9 atom % or less, and further preferably 8 atom % or less. In order to ensure the RA/RE ratio of 3 or more, it may be desired for the etching mask film 3 to have the carbon content of 1 atom % or more. In the etching mask film 3, the C1s narrow spectrum obtained by X-ray photoelectron spectroscopy analysis preferably has the maximum peak at a binding energy of not less than 282 eV and not more than 284 eV.

From the perspective of enhancement of the RA/RE ratio for the light shielding film 4 and the etching mask film 3, it is better not to contain elements (such as oxygen or nitrogen), which increases the etching rate in the dry etching with the oxygen-containing chlorine-based gas, in the material for forming the etching mask film 3 as far as possible. The total content of oxygen and nitrogen in the etching mask film 3 is preferably 5 atom % or less, more preferably 3 atom % or less, and further preferably 1 atom % or less. In the etching mask film 3, the maximum peak of O1s narrow spectrum obtained by X-ray photoelectron spectroscopy analysis may be not more than the detection lower limit. In the etching mask film 3, the maximum peak of N1s narrow spectrum obtained by X-ray photoelectron spectroscopy analysis also may be not more than the detection lower limit.

Given the decrease in oxygen content in the etching mask film 3, it is preferable to contain carbon in the etching mask film 3 by adding a carbon-containing gas free of oxygen (hydrocarbon-based gas, such as $CH_4$, $C_2H_6$, or $C_2H_4$) to a reactive gas in a film forming gas during the formation of the etching mask film 3 by a sputtering method. The etching mask film 3 may also be formed by the sputtering method using a target containing chromium and carbon.

The etching mask film 3 may contain elements (such as hydrogen or boron) other than the above as long as the etching rate in the dry etching with the oxygen-containing chlorine-based gas does not significantly change Further, the etching mask film 3 may contain a noble gas element such as helium, neon, argon, krypton, and xenon. The preferred material for the etching mask film 3 includes, for example, CrSi and CrC.

As described above, the reduction amount of thickness of the etching mask film 3 due to the dry etching for forming the second pattern in the light shielding film 4 should be less than 5 nm. The etching mask film 3 after the thickness reduction by the dry etching of the light shielding film 4 is provided with the first pattern (light-semitransmissive pattern) formed therein by the dry etching described in detail below. The etching mask film 3 with the first pattern formed therein should function as an etching mask in the dry etching for forming the first pattern in the light-semitransmissive film 2. Also, there is an oft-requested level for CD accuracy or accuracy in sidewall shape of the first pattern formed in the etching mask film 3 that functions as a mask in the dry etching for forming the first pattern in the light-semitransmissive film 2. In order that the etching mask film 3 may sufficiently function as an etching mask, the remaining thickness should be 2 nm or more.

In the electron beam drawing for forming the first pattern in the resist film, the etching mask film 3 immediately thereunder has sufficient conductivity, preferably. In order to ensure the conductivity in the etching mask film 3, the remaining thickness should be 2 nm or more. While depending on the material for forming the etching mask film 3, the thickness of the etching mask film 3 is preferably 14 nm or less, and more preferably 12 nm or less. Further, the thickness of the etching mask film 3 is preferably 3 nm or more, and more preferably 4 nm or more.

There is no particular limitation on the transparent substrate 1, provided that it is transparent to the exposure light wavelength used. In the present disclosure, a synthetic quartz glass substrate, various other glass substrates (e.g., soda-lime glass, aluminosilicate glass, etc.), and a calcium fluoride substrate may be used. Refinement of a pattern for the semiconductor device requires shortening of a wavelength of an exposure light source used in photolithography during the manufacture of the semiconductor device, in addition to the refinement of a mask pattern formed in the light-semitransmissive film 2. Nowadays, the exposure light sources used in the manufacture of semiconductor devices are shifting from KrF excimer lasers (wavelength: 248 nm) to ArF excimer lasers (wavelength: 193 nm), that is, shorter wavelength light sources are increasingly used. Among the various glass substrates, the synthetic quartz glass substrate has particularly high transparency at a wavelength of the ArF excimer lasers or in a shorter wavelength range, and thus, it is suitable as a substrate for the mask blank of the present disclosure used in forming a high-definition transfer pattern.

The light-semitransmissive film 2 is made of a material which can be dry-etched with the etching gas containing the fluorine-based gas. The light-semitransmissive film 2 has a function to transmit the exposure light at the predetermined transmittance. The transmittance of the light-semitransmissive film 2 with respect to the exposure light is preferably 1% or more. The light-semitransmissive film 2 is preferably a phase shift film used for a half tone phase shift mask, or a light-semitransmissive film used for an enhancer-type phase shift mask.

The light-semitransmissive film (phase shift film) 2 of the half tone phase shift mask blank transmits the light at an intensity not substantially contributing to the light exposure (e.g., 1% to 30% with respect to the exposure wavelength), and has a predetermined phase difference (e.g., 150 degrees to 180 degrees). Thus, a phase of light transmitted through a light-semitransmissive portion formed by patterning the light-semitransmissive film 2 is in a substantially inverted relation with respect to a phase of light transmitted through a light-transmissive portion which transmits the light at an intensity substantially contributing to the light exposure and has no light-semitransmissive portion formed therein. In this way, the two rays of light passed nearby a boundary between the light-semitransmissive portion and the light-transmissive portion enter the other's region due to a diffraction phenomenon, thereby annihilating each other, so that a light intensity at the boundary is nearly zero, and a contrast, i.e., a resolution, at the boundary is improved.

While the light-semitransmissive film 2 of the mask blank for the enhancer-type phase shift mask transmits the light at an intensity not substantially contributing to the light exposure (e.g., 1% to 30% with respect to the exposure wavelength), it has a small phase difference caused in the transmitted exposure light (e.g., the phase difference of 30 degrees or less, and is preferably 0 degrees), which is different from the light-semitransmissive film 2 for the half tone phase shift mask blank.

While the light-semitransmissive film 2 can be made of the material containing silicon, it is preferably made of a material containing silicon and nitrogen. Further, the light-semitransmissive film 2 is more preferably made of a material containing silicon, a transition metal, and nitrogen. In this case, the transition metal includes one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), palladium (Pd), etc., or alloys of these metals. In addition to the above elements, the material of the light-semitransmissive film 2 may contain elements such as oxygen (O), carbon (C), hydrogen (H), and boron (B). The material of the light-semitransmissive film 2 may also contain a noble gas element such as helium (He), argon (Ar), krypton (Kr), and xenon (Xe).

These materials have a high etching rate in the dry etching with the etching gas containing the fluorine-based gas, and thus, help to obtain various properties required for the light-semitransmissive film 2. In particular, these materials are desirable as materials for forming a phase shift film which should strictly control the phase of the exposure light transmitted through the light-semitransmissive film, or a light-semitransmissive film for the enhancer-type phase shift mask having the laminated structure of a phase delay film and a phase progression film. When the light-semitransmissive film 2 is the half tone phase shift film or a semitransparent laminated film, a percentage [%] calculated by dividing the content [atom %] of transition metal (M) by the total content [atom %] of transition metal (M) and silicon (Si) in the film (M/(M+Si) ratio) is preferably 35% or less, more preferably 25% or less, and further preferably 20% or less. The transition metal is an element having a higher extinction coefficient and a higher refractive index than silicon. When a refractive index of a material for forming the light-semitransmissive film 2 is too high, a phase change amount due to a film thickness variation becomes large, and thus, it becomes difficult to control both the phase and transmittance.

The light-semitransmissive film 2 can be made of a material which contains a material containing silicon and nitrogen and further contains one or more elements selected from metalloid elements, non-metallic elements, and noble gases (hereinafter collectively referred to as "silicon-based material"). The light-semitransmissive film 2 made of the silicon-based material does not contain transition metals which trigger the decrease in light fastness against the ArF exposure light. Further, the light-semitransmissive film 2 does not contain metallic elements other than transition metals, since it is undeniable that they may also trigger the decrease in light fastness against the ArF exposure light. The light-semitransmissive film 2 made of the silicon-based material may contain any of metalloid elements. It preferably contains one or more elements selected from boron, germanium, antimony, and tellurium among the metalloid elements, since it can be expected to increase the conductivity of silicon that is used as a target during the formation of the light-semitransmissive film 2 by the sputtering method.

The light-semitransmissive film 2 made of the silicon-based material may contain the noble gas element such as helium (He), neon (Ne), argon (Ar), krypton (Kr), and xenon (Xe). The oxygen content in the light-semitransmissive film 2 made of the silicon-based material is preferably controlled to be 10 atom % or less, and more preferably 5 atom % or less, and it is further preferable that oxygen is not positively contained (the result of a composition analysis through X-ray photoelectron spectroscopy is not more than the detection lower limit). This is because the silicon-based material containing oxygen tends to significantly decrease the extinction coefficient k, which creates a need to increase the entire thickness of the light-semitransmissive film 2. The light-semitransmissive film 2 made of the silicon-based material, except for the inevitably oxidized surface layer (oxidized layer), can be configured as a single layer or as a lamination layer comprised of a plurality of layers.

The light shielding film 4 can be a single layer structure, or a laminated structure comprised of two or more layers. In the transfer mask manufactured from the mask blank of the present disclosure, the laminated structure of the light-semitransmissive film 2, the etching mask film 3, and the light shielding film 4 forms a light shielding band. In the mask blank of the present disclosure, the optical density (OD) with respect to the exposure light in the laminated structure of the light-semitransmissive film 2, the etching mask film 3, and the light shielding film 4 should be at least greater than 2.0, desirably 2.8 or more, and preferably 3.0 or more. Since the light-semitransmissive film 2 has the predetermined transmittance with respect to the exposure light depending on the intended use, the optical density of the etching mask film 3 and the light shielding film 4 is to be adjusted.

While a method for forming the light-semitransmissive film 2, the etching mask film 3, and the light shielding film 4 on the transparent substrate 1 preferably includes, for example, a sputtering deposition method, it is not necessarily limited to the sputtering deposition method in the present disclosure.

While the mask blank and the transfer mask of the present disclosure are applicable to any exposure light, such as the ArF excimer laser, KrF excimer laser, and i-line light, they are preferably applied in particular to the photolithography using the ArF excimer laser as the exposure light.

Embodiment 1 of the present disclosure also provides a transfer mask in which a light-semitransmissive pattern is formed in the light-semitransmissive film 2 of the mask blank according to Embodiment 1 above and a light shielding pattern is formed in the etching mask film 3 and the light shielding film 4; and a method for manufacturing the transfer mask. FIGS. 3(A) to 3(H) are cross-sectional views showing a manufacturing process of the transfer mask according to Embodiment 1 of the present disclosure. The method for manufacturing the transfer mask according to Embodiment 1 is described below in accordance with the manufacturing process shown in FIGS. 3(A) to 3(H). The detailed structure of the mask blank 100 used here is as stated above.

First, a first resist film made of an organic material is formed in contact with a surface of the light shielding film 4 of the mask blank 100. Next, a second pattern including a desired light shielding band pattern to be formed in the light shielding film 4 is drawn on the resist film, and the development process is conducted, thereby forming the first resist film (resist pattern) 5b having the second pattern including the desired light shielding band pattern (see FIG. 3(A)).

Figure 3:
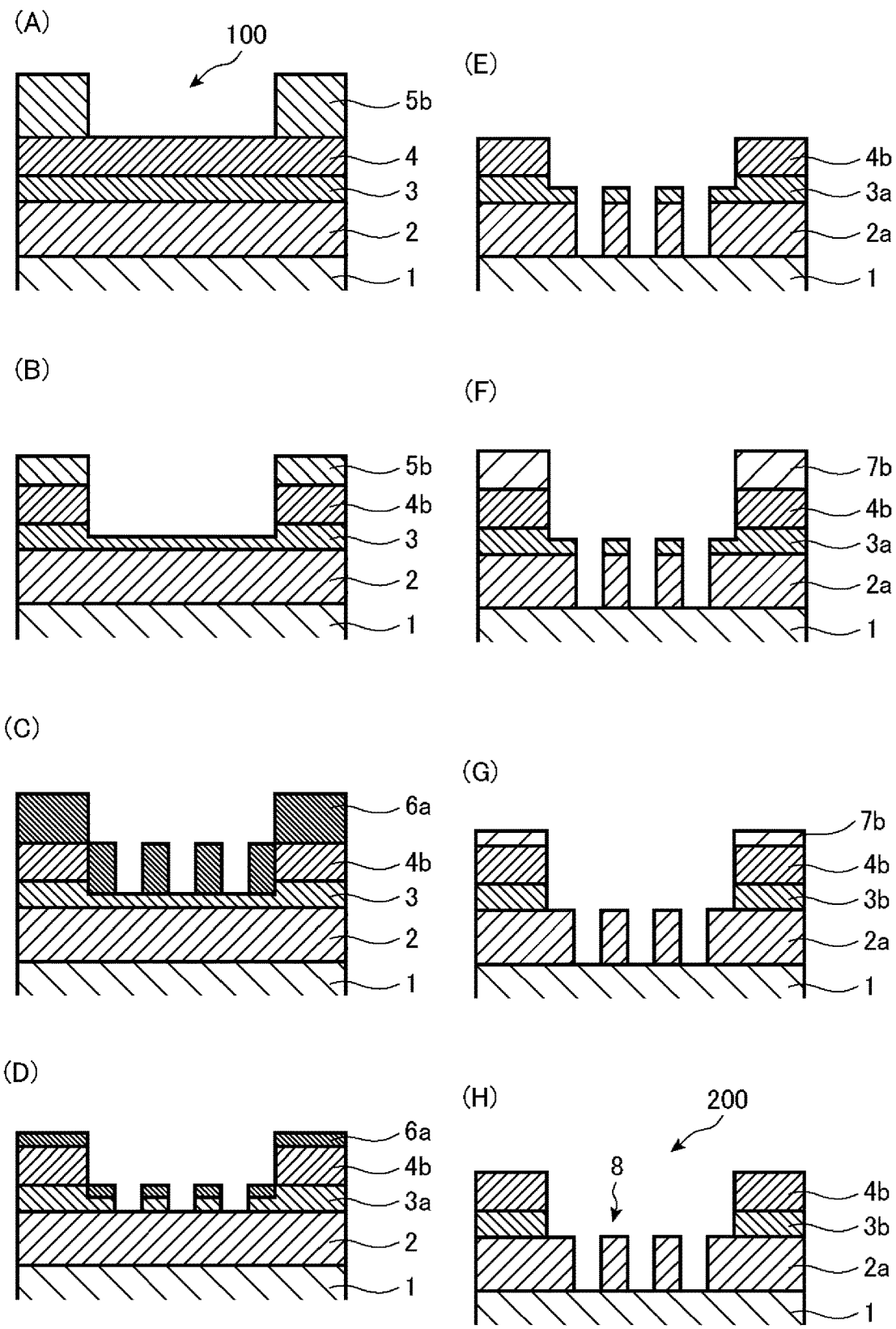
FIGS. 3(A) to 3(H) are cross-sectional views showing a manufacturing process of the transfer mask according to Embodiment 1 of the present disclosure.

Next, the dry etching is performed on the light shielding film 4 with the oxygen-containing chlorine-based gas using the resist pattern 5b as a mask to form the light shielding film (light shielding pattern) 4b having the second pattern (see FIG. 3(B)). In the dry etching of the light shielding film 4, the etching needs to reach the lower end of the light shielding film 4 throughout all the regions of the light shielding film 4 to be removed. Thus, when the dry etching first reaches the lower end in a region of the light shielding film 4, the dry etching should not be terminated, rather the additional etching (overetching) should be performed so as to remove all the regions of the light shielding film 4 to be removed.

At this time, the etching mask film 3 is also etched to a certain degree from its surface, but the etching mask film 3 which remained after etching the light shielding film 4 has a thickness of 2 nm or more. After that, the remaining resist pattern 5b is removed. The chlorine-based gas in the oxygen-containing chlorine-based gas used in the dry etching of the light shielding film 4 may include, for example, $Cl_2$, $SiCl_4$, $CHCl_3$, $CH_2Cl_2$, $CCl_4$, $BCl_3$, and the like. The same holds for the oxygen-containing chlorine-based gas used in the dry etching of the etching mask film 3 described below.

Then, a second resist film made of an organic material is formed in contact with surfaces of the etching mask film 3 and light shielding pattern 4b. A first pattern including a desired light-semitransmissive pattern (transfer pattern) to be formed in the light-semitransmissive film 2 is drawn on the second resist film, and the development process is conducted, thereby forming the second resist film (resist pattern) 6a having the first pattern including the desired light-semitransmissive pattern (see FIG. 3(C)).

Next, the dry etching is performed on the etching mask film 3 with the oxygen-containing chlorine-based gas using the resist pattern 6a as a mask to form the etching mask film 3a having the first pattern (see FIG. 3(D)). After that, the remaining resist pattern 6a is removed.

The dry etching is then performed on the light-semitransmissive film 2 with the fluorine-based gas using as a mask the etching mask film 3a having the first pattern to form the light-semitransmissive film (light-semitransmissive pattern) 2a having the first pattern (see FIG. 3(E)). The fluorine-based gas used in this dry etching includes an etching gas, such as $SF_6$, $CHF_3$, $CF_4$, $C_2F_6$, $C_4F_8$, and the like. The fluorine-based gas in the present disclosure further includes a mixed gas of the gas containing fluorine as listed above and a gas such as helium or oxygen. The fluorine-based gas not containing carbon ($SF_6$) is preferable as an etching gas for etching the light-semitransmissive film 2 since the etching selectivity between the light-semitransmissive film 2 made of the material containing silicon and the transparent substrate 1 is relatively easily obtained.

Then, a third resist film (resist pattern) 7b made of an organic material and having the second pattern is formed in contact with the light shielding pattern 4b by a procedure similar to the first resist film (see FIG. 3(F)).

The dry etching is performed on the etching mask film 3a having the first pattern with the oxygen-containing chlorine-based gas using the resist pattern 7b as a mask to form the etching mask film 3b having the second pattern (see FIG. 3(G)). After that, the remaining resist pattern 7b is removed, and the predetermined cleaning is conducted, such that a transfer mask 200 is obtained (see FIG. 3(H)).

As for the transfer mask 200, the dry etching is performed directly on the etching mask film 3 using as a mask the second resist film 6a having a pattern including the transfer pattern to be formed in the light-semitransmissive film 2, and thus, the first pattern including the transfer pattern shown as the etching mask film 3a can be formed with high accuracy. Further, since the dry etching is performed on the light-semitransmissive film 2 using as a mask the etching mask film 3a having the first pattern including the transfer pattern formed with high accuracy, the light-semitransmissive pattern 2a can be formed in the light-semitransmissive film 2 with high accuracy.

The present disclosure also provides a method for manufacturing a semiconductor device using the transfer mask 200 according to Embodiment 1 above. The transfer mask 200 of the present disclosure has the fine transfer pattern formed therein with high accuracy. Therefore, when the transfer mask 200 is used for the exposure transfer to the resist film on the semiconductor device, a pattern can be formed in the resist film on the semiconductor device with the accuracy that sufficiently satisfies the design specification.

Figure 4:
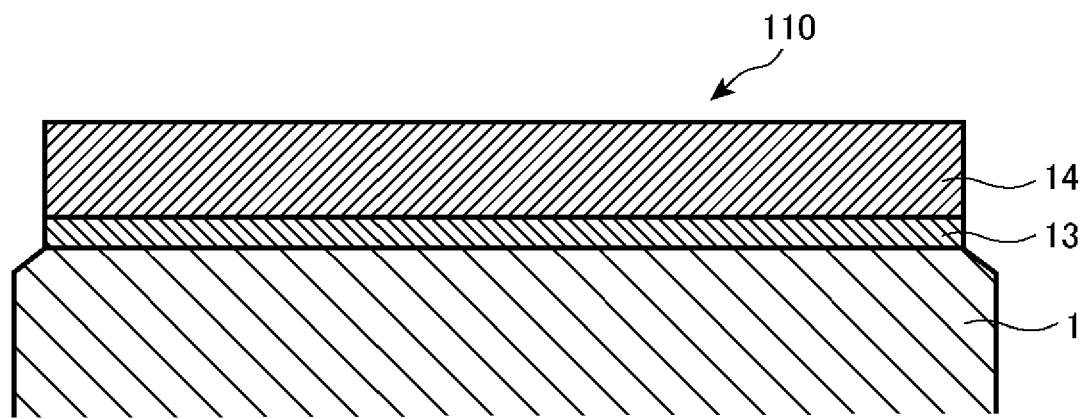
FIG. 4 is a cross-sectional view showing a structure of a mask blank according to Embodiment 2 of the present disclosure.
Figure 5:
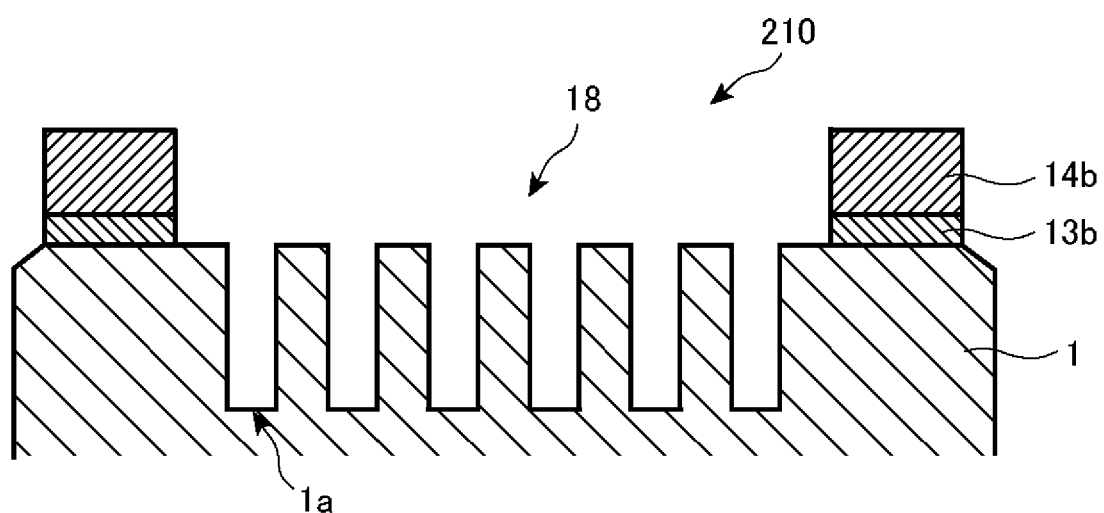
FIG. 5 is a cross-sectional view showing a structure of a transfer mask according to Embodiment 2 of the present disclosure.

Embodiment 2 is described in detail below. FIG. 4 is a cross-sectional view showing a structure of the mask blank according to Embodiment 2 of the present disclosure. The mask blank 110 of the present disclosure shown in FIG. 4 has a structure in which an etching mask film 13 and a light shielding film 14 are laminated in this order on the transparent substrate 1. FIG. 5 is a cross-sectional view showing a structure of a transfer mask (chromeless phase shift mask) according to Embodiment 2 of the present disclosure. The transfer mask 210 of the present disclosure shown in FIG. 5 has in the transparent substrate 1 a third pattern including an etching pattern (transfer pattern 18) etched to a predetermined depth into the surface of the transparent substrate 1, and further has a structure in which the etching mask film (etching mask pattern) 13b with a fourth pattern including a light shielding band pattern formed therein and the light shielding film (light shielding pattern) 14b with the fourth pattern formed therein are laminated in this order on the transparent substrate 1.

The transfer mask 210 is configured to have a predetermined phase difference (150 degrees to 190 degrees) between the exposure light transmitted through an etched portion 1a of the transparent substrate 1 where the etching pattern has been etched and the exposure light transmitted through a non-etched portion where no etching pattern has been etched. The predetermined etching depth in the etched portion 1a is set so as to obtain the above predetermined phase difference. For example, for the transfer mask for which the ArF excimer laser is used as the exposure light, the predetermined etching depth is preferably between 144 nm and 183 nm.

The etching mask film 13 of Embodiment 2 is similar to the etching mask film 3 of Embodiment 1 except for matters related to the thickness. The light shielding film 14 of Embodiment 2 is similar to the light shielding film 4 of Embodiment 1 except for matters related to the optical density (OD) with respect to the exposure light which is required for the laminated structure of the light shielding film 14 and the etching mask film 13 and matters related to the thickness of the light shielding film 14. The transparent substrate 1 of Embodiment 2 is similar to the transparent substrate 1 of Embodiment 1.

The etching mask film 13 needs to function as an etching mask until the etched portion 1a having the above predetermined etching depth is formed in the transparent substrate 1 by the dry etching with the fluorine-based gas. Thus, after the fourth pattern including the light shielding band pattern is formed in the light shielding film 14 and before the dry etching for forming the etched portion 1a is performed, the remaining etching mask film 13 should have the thickness of at least 4 nm or more. In view of these points, while depending on the material for forming the etching mask film 13, the thickness of the etching mask film 13 is preferably 15 nm or less, and more preferably 13 nm or less. Further, the thickness of the etching mask film 13 is preferably 5 nm or more, and more preferably 6 nm or more.

In Embodiment 2, when the transfer mask 210 is manufactured, the light shielding band is formed by the laminated structure of the light shielding film 14 and the etching mask film 13. Thus, the optical density (OD) with respect to the exposure light in the laminated structure of the light shielding film 14 and the etching mask film 13 should be at least greater than 2.0, desirably 2.8 or more, and preferably 3.0 or more. The optical density required for the light shielding film 14 is higher than that of the light shielding film 4 of Embodiment 1. Thus, the thickness of the light shielding film 14 is preferably 80 nm or less, and more preferably 75 nm or less. Further, the thickness of the light shielding film 14 is preferably 40 nm or more, and more preferably 45 nm or more.

Embodiment 2 of the present disclosure also provides a transfer mask in which the third pattern including the transfer pattern comprised of the etching pattern is formed in the transparent substrate 1 of the mask blank according to Embodiment 2 above and the fourth pattern including the light shielding band pattern is formed in the etching mask film 13 and the light shielding film 14; and a method for manufacturing the transfer mask. FIGS. 6(A) to 6(H) are cross-sectional views showing a manufacturing process of the transfer mask according to Embodiment 2 of the present disclosure. The method for manufacturing the transfer mask according to Embodiment 2 is described below in accordance with the manufacturing process shown in FIGS. 6(A) to 6(H). The detailed structure of the mask blank 110 used here is as stated above.

First, a fourth resist film made of an organic material is formed in contact with a surface of the light shielding film 14 of the mask blank 110. Next, the fourth pattern including the desired light shielding band pattern to be formed in the light shielding film 14 is drawn on the fourth resist film, and the development process is conducted, thereby forming the fourth resist film (resist pattern) 15b having the fourth pattern including the desired light shielding band pattern (see FIG. 6(A)).

Figure 6:
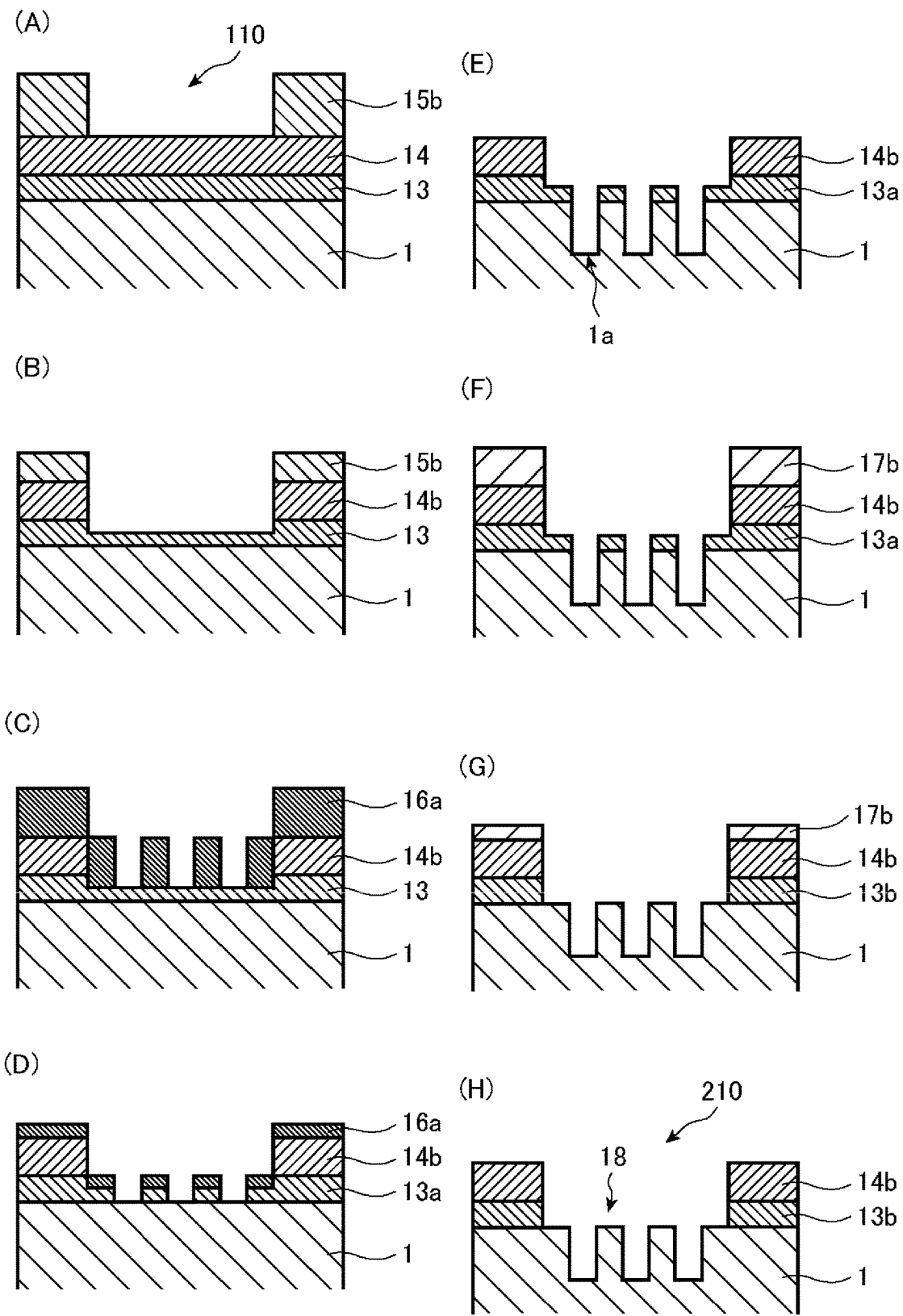
FIGS. 6(A) to (H) are cross-sectional views showing a manufacturing process of the transfer mask according to Embodiment 2 of the present disclosure.

Next, the dry etching is performed on the light shielding film 14 with the oxygen-containing chlorine-based gas using the resist pattern 15b as a mask to form the light shielding film (light shielding pattern) 14b having the fourth pattern (see FIG. 6(B)). In the dry etching of the light shielding film 14, the etching needs to reach the lower end of the light shielding film 14 throughout all the regions of the light shielding film 14 to be removed. Thus, when the dry etching first reaches the lower end in a region of the light shielding film 14, the dry etching should not be terminated, rather the additional etching (overetching) should be performed so as to remove all the regions of the light shielding film 14 to be removed.

At this time, the etching mask film 13 is also etched to a certain degree from its surface, but the etching mask film 13 which remained after etching the light shielding film 14 has a thickness of 4 nm or more. After that, the remaining resist pattern 15b is removed.

Then, a fifth resist film made of an organic material is formed in contact with surfaces of the transparent substrate 1, the etching mask film 13, and the light shielding film (light shielding pattern) 14b having the fourth pattern. The third pattern including a desired etching pattern (transfer pattern) to be formed in the transparent substrate 1 is drawn on the fifth resist film, and the development process is conducted, thereby forming the fifth resist film (resist pattern) 16a having the third pattern including the desired transfer pattern (see FIG. 6(C)).

Next, the dry etching is performed on the etching mask film 13 with the oxygen-containing chlorine-based gas using the resist pattern 16a as a mask to form the etching mask film 13a having the third pattern (see FIG. 6(D)). After that, the remaining resist pattern 16a is removed.

The dry etching is then performed on the transparent substrate 1 with the fluorine-based gas using as a mask the etching mask film 13a having the third pattern to form in the transparent substrate 1 the third pattern including the etching pattern (transfer pattern 18) etched to a predetermined depth from the surface of the transparent substrate 1 (see FIG. 6(E)).

Subsequently, a sixth resist film (resist pattern) 17b made of an organic material and having the fourth pattern is formed in contact with the light shielding film 14b by a procedure similar to the fourth resist film (see FIG. 6(F)).

The dry etching is performed on the etching mask film 13a with the oxygen-containing chlorine-based gas using the resist pattern 17b as a mask to form the etching mask film 13b having the fourth pattern (see FIG. 6(G)). After that, the remaining resist pattern 17b is removed, and the predetermined cleaning is conducted, such that a transfer mask 210 is obtained (see FIG. 6(H)).

The oxygen-containing chlorine-based gas used in the dry etching of the light shielding film 14 and the etching mask film 13 is similar to the one used in the method for manufacturing a transfer mask of Embodiment 1. Further, as the fluorine-based gas used in the dry etching in the method for manufacturing a transfer mask of Embodiment 2, the fluorine-based gas containing carbon ($CF_4$, $CHF_3$, $C_2F_6$, $C_4F_8$, and the like) is applied. The gas made by mixing the gas such as helium or oxygen with this fluorine-based gas is also applicable.

As for the transfer mask 210, the dry etching is performed directly on the etching mask film 13 using as a mask the fifth resist film having the third pattern including the desired etching pattern (transfer pattern 18) to be formed in the transparent substrate 1, and thus, the third pattern including the transfer pattern can be formed in the etching mask film 13 with high accuracy. Moreover, the dry etching is performed on the transparent substrate 1 using as a mask the etching mask film 13a having the third pattern including the transfer pattern formed with high accuracy, and thus, the etching pattern (transfer pattern 18) can be formed in the transparent substrate 1 with high accuracy.

The present disclosure also provides a method for manufacturing a semiconductor device using the transfer mask 210 according to Embodiment 2 above. The transfer mask 210 of the present disclosure has the fine transfer pattern formed with high accuracy. Therefore, when the transfer mask 210 is used for the exposure transfer to the resist film on the semiconductor device, a pattern can be formed in the resist film on the semiconductor device with the accuracy that sufficiently satisfies the design specification.

As an alternative embodiment of the mask blank 110 according to Embodiment 2 above, there is a mask blank which includes an etching stopper film and a phase shift film between the transparent substrate 1 and the etching mask film 13. The phase shift film of the mask blank of the alternative embodiment is made of a material which contains silicon and oxygen and is transparent to the exposure light. Further, the phase shift film has a function to transmit the exposure light at a transmittance of 95% or more (preferably 96% or more, and more preferably 97% or more), and a function to generate a phase difference of not less than 150 degrees and not more than 190 degrees between the exposure light transmitted through the phase shift film and the exposure light transmitted through the air for the same distance as the thickness of the phase shift film.

The etching stopper film of the alternative embodiment is made of a material which has sufficient etching selectivity in relation to the above-described phase shift film in the dry etching with the fluorine-based gas for forming the transfer pattern in the phase shift film. This etching stopper film preferably has a high transmittance with respect to the exposure light, and high etching selectivity in relation to the phase shift film. The material for forming the etching stopper film includes a material containing aluminum and oxygen, a material containing aluminum, silicon, and oxygen, a material containing hafnium and oxygen, and the like. The other matters related to the transparent substrate, the etching mask film, and the light shielding film are similar to those of the mask blank according to Embodiment 2 above.

The mask blank of the alternative embodiment has a structure in which the etching stopper film, the phase shift film, the etching mask film, and the light shielding film are laminated in this order on the transparent substrate. It is featured in that the phase shift film is made of the material containing silicon and oxygen; the etching stopper film is made of the material which has etching selectivity in relation to the phase shift film when forming the transfer pattern in the phase shift film by the dry etching using the fluorine-based gas; the etching mask film is made of the material containing chromium; the light shielding film is made of the material containing chromium and oxygen; and a ratio of the etching rate of the light shielding film to the etching rate of the etching mask film in the dry etching using the oxygen-containing chlorine-based gas is not less than 3 and not more than 12.

When a transfer mask is manufactured from the mask blank of the alternative embodiment, the fine transfer pattern is formed in the phase shift film. Since the etching stopper film is provided between the phase shift film and the transparent substrate, such a transfer mask is superior in phase controllability to the transfer mask 210 of Embodiment 2 which has the transfer pattern 18 formed therein by etching away the transparent substrate 1.

The transfer mask of the alternative embodiment is featured in that a fifth pattern including the transfer pattern is formed in the phase shift film of the above mask blank of the alternative embodiment and a sixth pattern including the light shielding band pattern is formed in the etching mask film and the light shielding film.

Further, a method of manufacturing the transfer mask of the alternative embodiment uses the above mask blank of the alternative embodiment. The transfer mask has the fifth pattern including the transfer pattern in the phase shift film and the sixth pattern including the light shielding band pattern in the etching mask film and the light shielding film. It is featured in that the method includes: performing the dry etching with the oxygen-containing chlorine-based gas using as a mask a seventh resist film having the sixth pattern formed on the light shielding film, thereby forming the sixth pattern in the light shielding film; performing the dry etching with the oxygen-containing chlorine-based gas using as a mask an eighth resist film having the fifth pattern formed on the etching mask film and the light shielding film, thereby forming the fifth pattern in the etching mask film; performing the dry etching with the fluorine-based gas using as a mask the etching mask film having the fifth pattern, thereby forming the fifth pattern in the phase shift film; and performing the dry etching with the oxygen-containing chlorine-based gas using as a mask a ninth resist film having the sixth pattern formed on the light shielding film, thereby forming the sixth pattern in the etching mask film.

EXAMPLES

Embodiments of the present disclosure are described more specifically below based on examples.

Example 1

The transparent substrate 1 was prepared, which had a main surface dimension of about 152 mm×about 152 mm and a thickness of about 6.35 mm, and was made of synthetic quartz glass. The transparent substrate 1 had been polished to have predetermined surface roughness (root mean square roughness Rq of 0.2 nm or less) in its end faces and main surfaces, and subjected to predetermined cleaning and drying processes.

Next, the transparent substrate 1 was placed in a single-wafer DC sputtering apparatus, a mixed target of molybdenum (Mo) and silicon (Si) (Mo:Si=12 atom %:88 atom %) was used, and the reactive sputtering (DC sputtering) in a mixed gas atmosphere of argon (Ar), nitrogen ($N_2$), and helium (He) was conducted, such that the light-semitransmissive film 2 made of molybdenum, silicon, and nitrogen (MoSiN film: Mo: 12 atom %, Si: 39 atom %, N: 49 atom %) and having a thickness of 69 nm was formed on the transparent substrate 1. The composition of the MoSiN film was obtained as a result from Auger electron spectroscopy (AES).

Then, the transparent substrate 1 with the above MoSiN film (light-semitransmissive film 2) formed thereon was subjected to a treatment for forming an oxidized layer in a surface layer of the light-semitransmissive film 2. In particular, a heating furnace (electric furnace) was used to conduct the heat treatment at a heating temperature of 450° C. in the air for one hour. The light-semitransmissive film 2 after the heat treatment was analyzed by Auger electron spectroscopy (AES). As a result, formation of the oxidized layer having a thickness of about 1.5 nm measured from the surface of the light-semitransmissive film 2 was confirmed, and the oxygen content in the oxidized layer was 42 atom %. For the MoSiN film (light-semitransmissive film 2) after the heat treatment, the transmittance and phase difference at a wavelength of the ArF excimer laser light (about 193 nm) were measured by a phase shift amount measurement apparatus. As a result, the transmittance was 6.07%, and the phase difference was 177.3 degrees.

Then, the transparent substrate 1 was placed in the single-wafer DC sputtering apparatus, a chromium (Cr) target was used, and the reactive sputtering (DC sputtering) in a mixed gas atmosphere of argon (Ar) and methane ($CH_4$) was conducted, such that the etching mask film 3 made of chromium and carbon (CrC film: Cr: 95 atom %, C: 5 atom %) and having a thickness of 6 nm was formed in contact with the surface of the light-semitransmissive film 2. The each film composition in the etching mask film 3 and the light shielding film 4 described below was obtained by electron spectroscopy for chemical analysis (ESCA: with RBS correction).

In this etching mask film 3, the C1s narrow spectrum obtained by X-ray photoelectron spectroscopy analysis had the maximum peak at a binding energy of not less than 282 eV and not more than 284 eV. Further, in this etching mask film 3, the respective maximum peaks of O1s and N1s narrow spectra obtained by X-ray photoelectron spectroscopy analysis were not more than the detection lower limit.

Then, the transparent substrate 1 was placed in the single-wafer DC sputtering apparatus, a chromium (Cr) target was used, and the reactive sputtering (DC sputtering) in a mixed gas atmosphere of argon (Ar), carbon dioxide ($CO_2$), and helium (He) was performed, such that the light shielding film 4 made of chromium, oxygen, and carbon (CrOC film: Cr: 56 atom %, O: 29 atom %, C: 15 atom %) and having a thickness of 43 nm was formed in contact with the surface of the etching mask film 3. The predetermined cleaning process was further conducted, such that the mask blank 100 of Example 1 was obtained.

[Manufacture of Transfer Mask]

Next, the mask blank 100 of Example 1 was used to manufacture the transfer mask 200 of Example 1 through the following procedure. First, the first resist film made of a chemically amplified resist for electron beam drawing and having a thickness of 100 nm was formed in contact with the surface of the light shielding film 4 by a spin coating method. Then, a second pattern including a light shielding band pattern was drawn on the first resist film with electron beams, and the predetermined development and cleaning processes were conducted, such that a first resist film (resist pattern) 5b having the second pattern was formed (see FIG. 3(A)).

Subsequently, the dry etching was performed on the light shielding film 4 with the oxygen-containing chlorine-based gas (gas flow ratio of $Cl_2:O_2=4:1$) using the resist pattern 5b as a mask, such that the light shielding film (light shielding pattern) 4b having the second pattern was formed (see FIG. 3(B)). The duration of the dry etching of the light shielding film 4 corresponded to the amount of time from the beginning of the dry etching to first arrival at the lower end in a region of the light shielding film 4 (just etching time) plus 30% of the just etching time. After that, the resist pattern 5b was removed. At this point, the etching mask film 3 in the regions where the light shielding film 4 was removed was also etched from its surface.

The etching mask film 3 which remained after etching the light shielding film 4 could have the thickness of 2.6 nm in the thinnest region in a plane (the most etched region). The difference in film thickness distribution in a plane of the etching mask film 3 was 3.4 nm at most, which was within the range below 5 nm. The ratio of the etching rate of the light shielding film 4 to the etching rate of the etching mask film 3 in the dry etching using the oxygen-containing chlorine-based gas was 3.6, which was within the range of not less than 3 and not more than 12.

Then, the second resist film made of the chemically amplified resist for electron beam drawing and having a thickness of 80 nm was formed in contact with the surfaces of the etching mask film 3 and the light shielding film 4b by the spin coating method. Then, a first pattern including a light-semitransmissive pattern (transfer pattern) to be formed in the light-semitransmissive film 2 was drawn on the second resist film with electron beams, and the predetermined development and cleaning processes were conducted, such that the second resist film (resist pattern) 6a having the first pattern was formed (see FIG. 3(C)). The first pattern included, in a transfer pattern forming region (inner region of 132 mm×104 mm), a transfer pattern of DRAM hp32 nm generation (a fine pattern including SRAF with a line width of 40 nm) to be formed in the light-semitransmissive film 2.

Next, the dry etching was performed on the etching mask film 3 with the oxygen-containing chlorine-based gas (gas flow ratio of $Cl_2:O_2=4:1$) using the resist pattern 6a as a mask, such that the etching mask film 3a having the first pattern was formed (see FIG. 3(D)). The thickness of the resist pattern 6a which remained after forming the etching mask film 3a was 31 nm, that is, the resist pattern 6a having the thickness of 20 nm or more could remain. After that, the resist pattern 6a was removed.

Then, the dry etching was performed with the etching gas containing the fluorine-based gas ($SF_6$+He) using as a mask the etching mask film 3a having the first pattern, such that the light-semitransmissive film (light-semitransmissive pattern) 2a having the first pattern was formed (see FIG. 3(E)).

Next, the third resist film made of the chemically amplified resist for electron beam drawing and having a thickness of 80 nm was formed in contact with the surfaces of the transparent substrate 1, the light-semitransmissive film 2a, the etching mask film 3a, and the light shielding film 4b by the spin coating method. Then, the second pattern including the light shielding band pattern was drawn on the third resist film with electron beams, and the predetermined development and cleaning processes were conducted, such that the third resist film (resist pattern) 7b having the second pattern was formed (see FIG. 3(F)).

Next, the dry etching was performed on the etching mask film 3a with the oxygen-containing chlorine-based gas (gas flow ratio of $Cl_2:O_2=4:1$) using the resist pattern 7b as a mask, such that the etching mask film 3b having the second pattern was formed (see FIG. 3(G)). After that, the remaining resist pattern 7b was removed, and the predetermined cleaning was conducted, such that the transfer mask 200 was obtained (see FIG. 3(H)).

[Evaluation of Pattern Transfer Performance]

Using AIMS193 (manufactured by Carl Zeiss), a simulation of a transfer image upon the exposure transfer to the resist film on the semiconductor device with the exposure light at a wavelength of 193 nm was performed on the manufactured transfer mask 200 of Example 1. As a result of inspection of the image transferred by exposure in this simulation, there was no short-circuit or disconnection found in patterns, which satisfied the design specification sufficiently. It can be considered from this result that the circuit pattern finally formed on the semiconductor device may have great accuracy, even if the transfer mask of Example 1 is set on a mask stage of the exposure apparatus to perform the exposure transfer to the resist film on the semiconductor device.

Example 2

The mask blank 100 of Example 2 was manufactured by a procedure similar to Example 1 except that the etching mask film 3 was made of CrSi. In particular, the transparent substrate 1 was placed in the single-wafer DC sputtering apparatus, a mixed target of chromium (Cr) and silicon (Si) (Cr:Si=97 atom %:3 atom %) was used, and the sputtering (DC sputtering) in an argon (Ar) gas atmosphere was performed, such that the etching mask film 3 made of chromium and silicon (CrSi film) and having a thickness of 4 nm was formed in contact with the surface of the light-semitransmissive film 2.

In the etching mask film 3, the Si2p narrow spectrum obtained by X-ray photoelectron spectroscopy analysis had the maximum peak at the binding energy of not less than 98 eV and not more than 101 eV. Further, in the etching mask film 3, the respective maximum peaks of O1s and N1s narrow spectra obtained by X-ray photoelectron spectroscopy analysis were not more than the detection lower limit.

[Manufacture of Transfer Mask]

Then, the mask blank 100 of Example 2 was used to manufacture the transfer mask 200 of Example 2 by a procedure similar to Example 1. Also in the manufacture of the transfer mask 200 in Example 2, the dry etching was performed on the light shielding film 4 with the oxygen-containing chlorine-based gas (gas flow ratio of $Cl_2:O_2=4:1$) using the resist pattern 5b as a mask, such that the light shielding film (light shielding pattern) 4b having the second pattern was formed.

By this process, the etching mask film 3 in the regions where the light shielding film 4 was removed was etched from its surface. The etching mask film 3 of Example 2 which remained after etching the light shielding film 4 could have the thickness of 2.0 nm in the thinnest region in a plane (the most etched region). The difference in film thickness distribution in a plane of the etching mask film 3 was 2.0 nm at most, which was within the range below 5 nm. The ratio of the etching rate of the light shielding film 4 to the etching rate of the etching mask film 3 in the dry etching using the oxygen-containing chlorine-based gas was 6.5, which was within the range of not less than 3 and not more than 12.

Also in the manufacture of the transfer mask 200 of Example 2, the dry etching was performed on the etching mask film 3 with the oxygen-containing chlorine-based gas (gas flow ratio of $Cl_2:O_2=4:1$) using the resist pattern 6a as a mask, such that the etching mask film 3a having the first pattern was formed. At this time, the thickness of the resist pattern 6a which remained after forming the etching mask film 3a was 24 nm, that is, the resist pattern 6a having the thickness of 20 nm or more could remain.

[Evaluation of Pattern Transfer Performance]

Using AIMS193 (manufactured by Carl Zeiss), a simulation of a transfer image upon the exposure transfer to the resist film on the semiconductor device with the exposure light at a wavelength of 193 nm was performed on the manufactured transfer mask 200 of Example 2. As a result of inspection of the image transferred by exposure in this simulation, there was no short-circuit or disconnection found in patterns, which satisfied the design specification sufficiently. It can be considered from this result that the circuit pattern finally formed on the semiconductor device may have great accuracy, even if the transfer mask of Example 2 is set on the mask stage of the exposure apparatus to perform the exposure transfer to the resist film on the semiconductor device.

Example 3

The transparent substrate 1 was prepared in a manner similar to Example 1. Then, the transparent substrate 1 was placed in the single-wafer DC sputtering apparatus, a chromium (Cr) target was used, and the reactive sputtering (DC sputtering) in the mixed gas atmosphere of argon (Ar) and methane ($CH_4$) was performed, such that the etching mask film 13 made of chromium and carbon (CrC film: Cr: 95 atom %, C: 5 atom %) and having a thickness of 8 nm was formed in contact with the surface of the transparent substrate 1. The each film composition in the etching mask film 13 and the light shielding film 14 described below was obtained by electron spectroscopy for chemical analysis (ESCA: with RBS correction).

In the etching mask film 13, the C1s narrow spectrum obtained by the X-ray photoelectron spectroscopy analysis had the maximum peak at the binding energy of not less than 282 eV and not more than 284 eV. Further, in this etching mask film 13, the respective maximum peaks of O1s and N1s narrow spectra obtained by X-ray photoelectron spectroscopy analysis were not more than the detection lower limit.

Then, the transparent substrate 1 was placed in the single-wafer DC sputtering apparatus, a chromium (Cr) target was used, and the reactive sputtering (DC sputtering) in the mixed gas atmosphere of argon (Ar), carbon dioxide ($CO_2$), and helium (He) was performed, such that the light shielding film 14 made of chromium, oxygen, and carbon (CrOC film: Cr: 56 atom %, O: 29 atom %, C: 15 atom %) and having a thickness of 71 nm was formed in contact with the surface of the etching mask film 13. The predetermined cleaning process was further conducted, such that the mask blank 110 of Example 3 was obtained.

[Manufacture of Transfer Mask]

Next, the mask blank 110 of Example 3 was used to manufacture the transfer mask 210 of Example 3 through the following procedure. First, the fourth resist film made of a chemically amplified resist for electron beam drawing and having a thickness of 100 nm was formed in contact with the surface of the light shielding film 14 by the spin coating method. Then, a fourth pattern including the light shielding band pattern was drawn on the fourth resist film with electron beams, and the predetermined development and cleaning processes were conducted, such that the fourth resist film (resist pattern) 15b having the fourth pattern was formed (see FIG. 6(A)).

Subsequently, the dry etching was performed on the light shielding film 14 with the oxygen-containing chlorine-based gas (gas flow ratio of $Cl_2:O_2=4:1$) using the resist pattern 15b as a mask, such that the light shielding film (light shielding pattern) 14b having the fourth pattern was formed (see FIG. 6(B)). The duration of the dry etching of the light shielding film 14 corresponded to the amount of time from the beginning of the dry etching to first arrival at the lower end in a region of the light shielding film 14 (just etching time) plus 20% of the just etching time. After that, the resist pattern 15b was removed. At this point, the etching mask film 13 in the regions where the light shielding film 14 was removed was also etched from its surface.

The etching mask film 13 which remained after etching the light shielding film 14 could have the thickness of 4.0 nm in the thinnest region in a plane (the most etched region). The difference in film thickness distribution in a plane of the etching mask film 13 was 4.0 nm at most, which was within the range below 5 nm. The ratio of the etching rate of the light shielding film 14 to the etching rate of the etching mask film 13 in the dry etching using the oxygen-containing chlorine-based gas was 3.6, which was within the range of not less than 3 and not more than 12.

Then, a fifth resist film made of the chemically amplified resist for electron beam drawing and having a thickness of 80 nm was formed in contact with the surfaces of the etching mask film 13 and the light shielding film 14b by the spin coating method. Then, a third pattern including the etching pattern (transfer pattern) to be formed in the transparent substrate 1 was drawn on the fifth resist film with electron beams, and the predetermined development and cleaning processes were conducted, such that the fifth resist film (resist pattern) 16a having the third pattern was formed (see FIG. 6(C)). The third pattern included, in a transfer pattern forming region (inner region of 132 mm×104 mm), a transfer pattern of DRAM hp22 nm generation to be formed in the transparent substrate.

Next, the dry etching was performed on the etching mask film 13 with the oxygen-containing chlorine-based gas (gas flow ratio of $Cl_2:O_2=4:1$) using the resist pattern 16a as a mask, such that the etching mask film 13a having the third pattern was formed (see FIG. 6(D)). The thickness of the resist pattern 16a which remained after forming the etching mask film 13a was 27 nm, that is, the resist pattern 16a having the thickness of 20 nm or more could remain. After that, the resist pattern 16a was removed.

Then, the dry etching was performed with the etching gas containing the fluorine-based gas ($CF_4$+He) using as a mask the etching mask film 13a having the third pattern, so that the third pattern including the etching pattern (transfer pattern 18) that was etched to a depth of 173 nm from the surface of the transparent substrate 1 was formed in the transparent substrate 1 (see FIG. 6(E)).

Then, a sixth resist film made of the chemically amplified resist for electron beam drawing and having a thickness of 80 nm was formed in contact with the surfaces of the transparent substrate 1, the etching mask film 13a, and the light shielding film 14b by the spin coating method. Then, the fourth pattern including the light shielding band pattern was drawn on the sixth resist film with electron beams, and the predetermined development and cleaning processes were conducted, such that the sixth resist film (resist pattern) 17b having the fourth pattern was formed (see FIG. 6(F)).

Next, the dry etching was performed on the etching mask film 13a with the oxygen-containing chlorine-based gas (gas flow ratio of $Cl_2:O_2=4:1$) using the resist pattern 17b as a mask, such that the etching mask film 13b having the fourth pattern was formed (see FIG. 6(G)). After that, the remaining resist pattern 17b was removed, and the predetermined cleaning was conducted, such that the transfer mask 210 was obtained (see FIG. 6(H)).

[Evaluation of Pattern Transfer Performance]

Using AIMS193 (manufactured by Carl Zeiss), a simulation of a transfer image upon the exposure transfer to the resist film on the semiconductor device with the exposure light at a wavelength of 193 nm was performed on the manufactured transfer mask 210 of Example 3. As a result of inspection of the image transferred by exposure in this simulation, there was no short-circuit or disconnection found in patterns, which satisfied the design specification sufficiently. It can be considered from this result that the circuit pattern finally formed on the semiconductor device may have great accuracy, even if the transfer mask of Example 3 is set on the mask stage of the exposure apparatus to perform the exposure transfer to the resist film on the semiconductor device.

Example 4

The mask blank 110 of Example 4 was manufactured by a procedure similar to Example 3 except that the etching mask film 13 was made of CrSi. In particular, the transparent substrate 1 was placed in the single-wafer DC sputtering apparatus, a mixed target of chromium (Cr) and silicon (Si) (Cr:Si=97 atom %:3 atom %) was used, and the sputtering (DC sputtering) in the argon (Ar) gas atmosphere was performed, such that the etching mask film 13 made of chromium and silicon (CrSi film) and having a thickness of 7 nm was formed in contact with the surface of the transparent substrate 1.

In the etching mask film 13, the Si2p narrow spectrum obtained by X-ray photoelectron spectroscopy analysis had the maximum peak at the binding energy of not less than 98 eV and not more than 101 eV. Further, in the etching mask film 13, the respective maximum peaks of O1s and N1s narrow spectra obtained by X-ray photoelectron spectroscopy analysis were not more than the detection lower limit.

[Manufacture of Transfer Mask]

The mask blank 110 of Example 4 was used to manufacture the transfer mask 210 of Example 4 by a procedure similar to Example 3. Also in the manufacture of the transfer mask 210 of Example 4, the dry etching was performed on the light shielding film 14 with the oxygen-containing chlorine-based gas (gas flow ratio of $Cl_2:O_2=4:1$) using the resist pattern 15b as a mask, such that the light shielding film (light shielding pattern) 14b having the fourth pattern was formed.

By this process, the etching mask film 13 in the regions where the light shielding film 14 was removed was etched from its surface. The etching mask film 13 of Example 4 which remained after etching the light shielding film 14 could have the thickness of 4.8 nm in the thinnest region in a plane (the most etched region). The difference in film thickness distribution in a plane of the etching mask film 13 was 2.2 nm at most, which was within the range below 5 nm. The ratio of the etching rate of the light shielding film 14 to the etching rate of the etching mask film 13 in the dry etching using the oxygen-containing chlorine-based gas was 6.5, which was within the range of not less than 3 and not more than 12.

Also in the manufacture of the transfer mask 210 of Example 4, the dry etching was performed on the etching mask film 13 with the oxygen-containing chlorine-based gas (gas flow ratio of $Cl_2:O_2=4:1$) using the resist pattern 16a as a mask, such that the etching mask film 13a having the first pattern was formed. At this time, the thickness of the resist pattern 16a which remained after forming the etching mask film 13a was 23 nm, that is, the resist pattern 16a having the thickness of 20 nm or more could remain.

[Evaluation of Pattern Transfer Performance]

Using AIMS193 (manufactured by Carl Zeiss), a simulation of a transfer image upon the exposure transfer to the resist film on the semiconductor device with the exposure light at a wavelength of 193 nm was performed on the manufactured transfer mask 210 of Example 4. As a result of inspection of the image transferred by exposure in this simulation, there was no short-circuit or disconnection found in patterns, which satisfied the design specification sufficiently. It can be considered from this result that the circuit pattern finally formed on the semiconductor device may have great accuracy, even if the transfer mask of Example 4 is set on the mask stage of the exposure apparatus to perform the exposure transfer to the resist film on the semiconductor device.

Comparative Example 1

The mask blank 100 of Comparative Example 1 was manufactured by a procedure similar to Example 1 except that the etching mask film 3 was made of Cr metal. In particular, the transparent substrate 1 was placed in the single-wafer DC sputtering apparatus, the chromium (Cr) target was used, and the sputtering (DC sputtering) in the argon (Ar) gas atmosphere was performed, such that the etching mask film 3 made of chromium (Cr film) and having a thickness of 8 nm was formed in contact with the surface of the light-semitransmissive film 2.

[Manufacture of Transfer Mask]

Then, the mask blank 100 of Comparative Example 1 was used to manufacture the transfer mask 200 of Comparative Example 1 by a procedure similar to Example 1. Also in the manufacture of the transfer mask 200 of Comparative Example 1, the dry etching was performed on the light shielding film 4 with the oxygen-containing chlorine-based gas (gas flow ratio of $Cl_2:O_2=4:1$) using the resist pattern 5b as a mask, such that the light shielding film (light shielding pattern) 4b having the second pattern was formed. By this process, the etching mask film 3 in the regions where the light shielding film 4 was removed was etched from its surface. The etching mask film 3 of Comparative Example 1 which remained after etching the light shielding film 4 could have the thickness of 2.8 nm in the thinnest region in a plane (the most etched region). However, the difference in film thickness distribution in a plane of the etching mask film 3 was 5.2 nm at most, i.e., not less than 5 nm.

The ratio of the etching rate of the light shielding film 4 to the etching rate of the etching mask film 3 in the dry etching using the oxygen-containing chlorine-based gas was 2.5, which did not fall within the range of not less than 3 and not more than 12.

Also in the manufacture of the transfer mask 200 of Comparative Example 1, the dry etching was performed on the etching mask film 3 with the oxygen-containing chlorine-based gas (gas flow ratio of $Cl_2:O_2=4:1$) using the resist pattern 6a as a mask, such that the etching mask film 3a having the first pattern was formed. At this time, the thickness of the resist pattern 6a which remained after forming the etching mask film 3a was 40 nm, that is, the resist pattern 6a having the thickness of 20 nm or more could remain.

[Evaluation of Pattern Transfer Performance]

Using AIMS193 (manufactured by Carl Zeiss), a simulation of a transfer image upon the exposure transfer to the resist film on the semiconductor device with the exposure light at a wavelength of 193 nm was performed on the manufactured transfer mask 200 of Comparative Example 1. As a result of inspection of the image transferred by exposure in this simulation, a transfer failure was found. The cause for the failure seemed to be that the dry etching for forming the second pattern in the light shielding film 4 in the manufacture of the transfer mask 200 enlarged the film thickness distribution in a plane of the etching mask film 3 to 5 nm or more, which prevented the first pattern from being formed in the etching mask film 3 with high accuracy, and thus eventually, the first pattern could not be formed in the light-semitransmissive film 2 with high accuracy. According to this result, if the transfer mask of Comparative Example 1 is set on the mask stage of the exposure apparatus to perform the exposure transfer to the resist film on the semiconductor device, a failure section would be developed in a circuit pattern finally formed on the semiconductor device.

DESCRIPTION OF REFERENCE NUMERALS

1: transparent substrate
1a: etched portion
2: light-semitransmissive film (phase shift film)
2a: light-semitransmissive pattern (light-semitransmissive film having a first pattern)
3, 13: etching mask film
3a: etching mask film having the first pattern
3b: etching mask pattern (etching mask film having a second pattern)
4, 14: light shielding film
4b: light shielding pattern (light shielding film having the second pattern)
5b: resist pattern (first resist film having the second pattern)
6a: resist pattern (second resist film having the first pattern)
7b: resist pattern (third resist film having the second pattern)
8, 18: transfer pattern
13a: etching mask film having a third pattern
13b: etching mask film having a fourth pattern
14b: light shielding film having the fourth pattern
15b: resist pattern (fourth resist film having the fourth pattern)
16a: resist pattern (fifth resist film having the third pattern)
17b: resist pattern (sixth resist film having the fourth pattern)
100, 110: mask blank
200, 210: transfer mask

What is claimed is:

1. A mask blank having a structure in which a light-semitransmissive film, an etching mask film, and a light shielding film are laminated, in this order, on a transparent substrate,
wherein the light-semitransmissive film is made of a material containing silicon,
wherein the etching mask film is made of a material containing chromium and silicon, the silicon content in the etching mask film being 10 atom % or less, and
wherein the light shielding film is made of a material containing chromium and oxygen.

2. The mask blank according to claim 1, wherein the total content of oxygen and nitrogen in the etching mask film is 5 atom % or less.

3. The mask blank according to claim 1, wherein the oxygen content in the light shielding film is 10 atom % or more.

4. The mask blank according to claim 1, wherein the light shielding film is made of a material which does not substantially contain silicon.

5. The mask blank according to claim 1, wherein the light-semitransmissive film is made of a material containing silicon and nitrogen.

6. The mask blank according to claim 1, wherein the silicon content in the etching mask film is 1 atom % or more.

7. The mask blank according to claim 1, wherein a thickness of the etching mask film is 14 nm or less.

8. The mask blank according to claim 1, wherein a Si2p narrow spectrum in the etching mask film obtained by X-ray photoelectron spectroscopy analysis has a maximum peak at a binding energy of not less than 98 eV and not more than 101 eV.

9. The mask blank according to claim 1, wherein the etching mask film is configured to have, when exposed to an etching mixture of oxygen and a chlorine-based gas, a first rate of etching, and
wherein the light shielding film is configured to have, when exposed to the etching mixture of oxygen and a chlorine-based gas, a second rate of etching that is at least three times, and not more than twelve times, the first rate of etching.

10. A mask blank having a structure in which an etching mask film and a light shielding film are laminated, in this order, on a transparent substrate,
wherein the etching mask film is made of a material containing chromium and silicon, the silicon content in the etching mask film being 10 atom % or less, and
wherein the light shielding film is made of a material containing chromium and oxygen.

11. The mask blank according to claim 10, wherein the total content of oxygen and nitrogen in the etching mask film is 5 atom % or less.

12. The mask blank according to claim 10, wherein the oxygen content in the light shielding film is 10 atom % or more.

13. The mask blank according to claim 10, wherein the light shielding film is made of a material which does not substantially contain silicon.

14. The mask blank according to claim 10, wherein the silicon content in the etching mask film is 1 atom % or more.

15. The mask blank according to claim 10, wherein a thickness of the etching mask film is 14 nm or less.

16. The mask blank according to claim 10, wherein a Si2p narrow spectrum in the etching mask film obtained by X-ray photoelectron spectroscopy analysis has a maximum peak at a binding energy of not less than 98 eV and not more than 101 eV.

17. The mask blank according to claim 10, wherein the etching mask film is configured to have, when exposed to an etching mixture of oxygen and a chlorine-based gas, a first rate of etching, and
wherein the light shielding film is configured to have, when exposed to the etching mixture of oxygen and a chlorine-based gas, a second rate of etching that is at least three times, and not more than twelve times, the first rate of etching.

18. A transfer mask having a structure in which a light-semitransmissive film, an etching mask film, and a light shielding film are laminated, in this order, on a transparent substrate,
wherein the light-semitransmissive film has a first pattern including a transfer pattern,
wherein the etching mask film and the light shielding film have a second pattern including a light shielding band pattern,
wherein the light-semitransmissive film is made of a material containing silicon,
wherein the etching mask film is made of a material containing chromium and silicon, the silicon content in the etching mask film being 10 atom % or less, and
wherein the light shielding film is made of a material containing chromium and oxygen.

19. The transfer mask according to claim 18, wherein the total content of oxygen and nitrogen in the etching mask film is 5 atom % or less.

20. The transfer mask according to claim 18, wherein the oxygen content in the light shielding film is 10 atom % or more.

21. The transfer mask according to claim 18, wherein the light shielding film is made of a material which does not substantially contain silicon.

22. The transfer mask according to claim 18, wherein the light-semitransmissive film is made of a material containing silicon and nitrogen.

23. The transfer mask according to claim 18, wherein the silicon content in the etching mask film is 1 atom % or more.

24. The transfer mask according to claim 18, wherein a thickness of the etching mask film is 14 nm or less.

25. The transfer mask according to claim 18, wherein a Si2p narrow spectrum in the etching mask film obtained by X-ray photoelectron spectroscopy analysis has a maximum peak at a binding energy of not less than 98 eV and not more than 101 eV.

26. The transfer mask according to claim 18, wherein the etching mask film is configured to have, when exposed to an etching mixture of oxygen and a chlorine-based gas, a first rate of etching, and
wherein the light shielding film is configured to have, when exposed to the etching mixture of oxygen and a chlorine-based gas, a second rate of etching that is at least three times, and not more than twelve times, the first rate of etching.

27. A transfer mask having a structure in which an etching mask film and a light shielding film are laminated, in this order, on a transparent substrate,
wherein the transparent substrate has a third pattern including a transfer pattern comprised of an etching pattern,
wherein the etching mask film and the light shielding film have a fourth pattern including a light shielding band pattern,
wherein the etching mask film is made of a material containing chromium and silicon, the silicon content in the etching mask film being 10 atom % or less, and
wherein the light shielding film is made of a material containing chromium and oxygen.

28. The transfer mask according to claim 27, wherein the total content of oxygen and nitrogen in the etching mask film is 5 atom % or less.

29. The transfer mask according to claim 27, wherein the oxygen content in the light shielding film is 10 atom % or more.

30. The transfer mask according to claim 27, wherein the light shielding film is made of a material which does not substantially contain silicon.

31. A method for manufacturing a semiconductor device, comprising an exposure transfer in which the transfer mask according to claim 18 is used to transfer a transfer pattern of the transfer mask onto a semiconductor substrate by a lithographic method.

32. A method for manufacturing a semiconductor device, comprising an exposure transfer in which the transfer mask according to claim 27 is used to transfer a transfer pattern of the transfer mask onto a semiconductor substrate by a lithographic method.

33. The transfer mask according to claim 27, wherein the silicon content in the etching mask film is 1 atom % or more.

34. The transfer mask according to claim 27, wherein a thickness of the etching mask film is 14 nm or less.

35. The transfer mask according to claim 27, wherein a Si2p narrow spectrum in the etching mask film obtained by X-ray photoelectron spectroscopy analysis has a maximum peak at a binding energy of not less than 98 eV and not more than 101 eV.

36. The transfer mask according to claim 27, wherein the etching mask film is configured to have, when exposed to an etching mixture of oxygen and a chlorine-based gas, a first rate of etching, and
wherein the light shielding film is configured to have, when exposed to the etching mixture of oxygen and a chlorine-based gas, a second rate of etching that is at least three times, and not more than twelve times, the first rate of etching.

* * * * *